(12) United States Patent
Emadi et al.

(10) Patent No.: US 12,100,723 B2
(45) Date of Patent: Sep. 24, 2024

(54) IMAGE SENSOR STRUCTURE WITH A LIGHT GUIDE LAYER AND A NANOWELL LAYER

(71) Applicant: ILLUMINA, INC., San Diego, CA (US)

(72) Inventors: Arvin Emadi, San Diego, CA (US); Ali Agah, San Diego, CA (US); Xiuyu Cai, San Diego, CA (US); Craig Lee Hetherington, San Diego, CA (US)

(73) Assignee: Illumina Inc., San Diego, CA (US)

( * ) Notice: Subject to any disclaimer, the term of this patent is extended or adjusted under 35 U.S.C. 154(b) by 116 days.

(21) Appl. No.: 17/418,525

(22) PCT Filed: Sep. 29, 2020

(86) PCT No.: PCT/US2020/053241
§ 371 (c)(1),
(2) Date: Jun. 25, 2021

(87) PCT Pub. No.: WO2021/071699
PCT Pub. Date: Apr. 15, 2021

(65) Prior Publication Data
US 2022/0352228 A1  Nov. 3, 2022

Related U.S. Application Data

(60) Provisional application No. 62/912,908, filed on Oct. 9, 2019.

(51) Int. Cl.
*H01L 27/146* (2006.01)
(52) U.S. Cl.
CPC .. *H01L 27/14625* (2013.01); *H01L 27/14621* (2013.01); *H01L 27/14623* (2013.01);
(Continued)

(58) Field of Classification Search
CPC ......... H01L 27/14625; H01L 27/14621; H01L 27/14623; H01L 27/1463; H01L 27/1464;
(Continued)

(56) References Cited

U.S. PATENT DOCUMENTS

| 2012/0156100 A1 | 6/2012 | Tsai et al. |
| 2013/0200251 A1 | 8/2013 | Velichko |

(Continued)

FOREIGN PATENT DOCUMENTS

| EP | 3505914 A1 | 3/2019 |
| JP | 2009172263 A | 8/2009 |

(Continued)

OTHER PUBLICATIONS

International Search Report and Written Opinion of the International Searching Authority for International Application No. PCT/US2020/053241 mailed on Jan. 15, 2021.

(Continued)

*Primary Examiner* — Jennifer D Bennett
(74) *Attorney, Agent, or Firm* — Heslin Rothenberg Farley and Mesiti, P.C.

(57) ABSTRACT

An image sensor structure including an image stack disposed over a device stack. The image stack includes a plurality of light detectors. A first optical filter stack is disposed over the image stack. The first optical filter stack includes a light guide layer. Light pipe cavities are disposed in the light guide layer. Each light pipe cavity is associated with a light detector. Each light pipe cavity has an aspect ratio that is greater than about 2.5 to about 1. A nanowell layer is disposed over the first optical filter stack. Nanowells are disposed in the nanowell layer. Each nanowell is associated with a light detector.

20 Claims, 16 Drawing Sheets

(52) U.S. Cl.
CPC ...... *H01L 27/1463* (2013.01); *H01L 27/1464* (2013.01); *H01L 27/14685* (2013.01)

(58) Field of Classification Search
CPC ......... H01L 27/14685; H01L 27/14683; H01L 27/14643
See application file for complete search history.

(56) References Cited

U.S. PATENT DOCUMENTS

| | | |
|---|---|---|
| 2014/0048898 A1 | 2/2014 | Fei et al. |
| 2014/0264685 A1 | 9/2014 | Cheng et al. |
| 2015/0056097 A1 | 2/2015 | Vaartstra |
| 2015/0079596 A1* | 3/2015 | Eltoukhy ............... G06F 16/214 435/6.12 |
| 2016/0356715 A1* | 12/2016 | Zhong ................... H01L 27/088 |
| 2017/0016830 A1* | 1/2017 | Chung .............. H01L 27/14609 |
| 2018/0155782 A1 | 6/2018 | Zhong |
| 2019/0198553 A1 | 6/2019 | Cai et al. |

FOREIGN PATENT DOCUMENTS

| | | |
|---|---|---|
| JP | 2011238636 A | 11/2011 |
| JP | 2014154834 A | 8/2014 |
| JP | 2015032636 A | 2/2015 |
| JP | 2017028241 A | 2/2017 |

OTHER PUBLICATIONS

Extended Search Report for Application No. PCT/US2020/053241 mailed on Sep. 20, 2023.

\* cited by examiner

IMAGE SENSOR STRUCTURE WITH A LIGHT GUIDE LAYER AND A NANOWELL LAYER

CROSS REFERENCE TO RELATED APPLICATIONS

This Patent Application is a national stage filing under 35 U.S.C. § 371 of International Application No. PCT/US2020/053241, filed on Sep. 29, 2020, which claims priority to U.S. Provisional Patent Application No. 62/912,908, filed Oct. 9, 2019, and entitled Image Sensor Structure. The entire contents of each of the said applications are hereby incorporated herein by reference in their entireties.

BACKGROUND

Image sensor structures, such as CMOS image sensors, often utilize a plurality of high density nanowells disposed in a nanowell layer to perform reactions on analytes disposed within the nanowells. The nanowell layer is disposed on a front or back side of the image sensor structure, which collects and analyses data from the reactions. For example, the analytes (such as clusters of DNA segments or the like) may be tagged with a fluorescent label and an excitation light may be directed onto the labeled analytes to cause them to fluoresce an emissive light.

The analytes may then emit photons of the fluorescent emissive light, which may be transmitted from the nanowells onto a plurality of light detectors (e.g., photodiodes) associated with the nanowells. The light detectors detect the emissive light photons. Device circuitry may be connected to the light detectors from within a device stack. The device circuitry may then processes and transmits data signals based on those detected photons. The data signals may then be analyzed to reveal properties of the analytes.

In a front side illuminated (FSI) image sensor structure, the nanowell layer is disposed on the front side of the image sensor structure, which is illuminated by the excitation light. In an FSI image sensor structure, the device stack is positioned between the nanowell layer and the plurality of light detectors. However, in such image sensor structures, a portion of the active (e.g., light sensing) area of the light detectors may be blocked by the device circuitry in the device stack. As light detector size and pitch get ever smaller, the portion of the active area that is blocked by the device stack may increase, reducing the sensitivity of the light detectors.

In a back side illuminated (BSI) image sensor structures, the nanowell layer is disposed on the back side of the image sensor structure, which is illuminated by the excitation light. In a BSI image sensor structure, the device stack is not positioned between the nanowell layer and the plurality of light detectors. Therefore, the device stack may not block the active area of the light detectors.

However, the device circuitry of the device stack is often used to aid in the reduction of crosstalk in a FSI image sensor structure. Such device circuitry may not be available to help reduce crosstalk in a BSI image sensor structure. Crosstalk includes emissive light that is transmitted from a nanowell, which is inadvertently detected by light detectors that are not associated with the nanowell.

Also unlike a FSI image sensor structure, the device stack may not be available in a BSI image sensor structure to aid in sufficiently blocking excitation light from reaching the light detectors. Further, the device stack may also not be available in a BSI image sensor structure to aid in efficiently collecting and focusing the emissive light emitting from the nanowells onto the light detectors.

BRIEF DESCRIPTION

The examples provided here can overcome the aforementioned challenges. For example, one example provides a BSI image sensor structure, which reduces crosstalk between nanowells and unassociated light detectors without the aid of a device stack. Further, another example provides a BSI image sensor structure, which can sufficiently block excitation light from the light detectors, and which can efficiently collect and focus emissive light onto the light detectors, without the aid of a device stack.

The present disclosure offers advantages and alternatives over the prior art by providing an image sensor structure that, when illuminated with excitation light directed toward nanowells from its backside, may reduce crosstalk between the nanowells and unassociated light detectors disposed in the image sensor structure without the aid of a device stack. Additionally, light pipe cavities disposed in the image sensor structure have aspect ratios and sidewall angles that are sized to sufficiently block excitation light and efficiently collect emissive light without the aid of a device stack. Further, the aspect ratios are not so large, and the sidewall angles are not so small, as to make the image sensor structure unreliable to manufacture.

An image sensor structure in accordance with one or more aspects of the present disclosure includes an image stack disposed over a device stack. The image stack includes a plurality of light detectors. A first optical filter stack is disposed over the image stack. The first optical filter stack includes a light guide layer and a plurality of light pipe cavities disposed in the light guide layer. Each light pipe cavity of the plurality of light pipe cavities is associated with a light detector in the plurality of light detectors. Each light pipe cavity has an aspect ratio that is greater than about 2.5 to 1. A nanowell layer is disposed over the first optical filter stack. A plurality of nanowells is disposed in the nanowell layer. Each nanowell is associated with a light detector in the plurality of light detectors.

In some examples, the light pipe cavities of the image sensor structure have a sidewall angle that is within the range of about 11 to about 1.2 degrees.

In some examples, the image sensor structure includes an optical filter material disposed in the light pipe cavities. The optical filter material being in direct contact with the light guide layer at sidewalls of the light pipe cavities.

In some examples, the image sensor structure includes a second optical filter stack disposed over the first optical filter stack. The first and second optical filter stacks have an overall aspect ratio that is greater than either one of the first filter stack and the second filter stack.

In some examples, the light guide layer of the image sensor structure includes one of a polymer material, a semiconductor material and a dielectric material.

In some examples, the first optical stack of the image sensor structure includes an intermediate layer disposed over the image stack and the light guide layer being disposed over the intermediate layer. The light guide layer is a metal layer that is disposed on the sidewalls of the light pipe cavities and is not disposed on the bottom surface of the light pipe cavities. The light guide layer has a thickness of about 100 nanometers or less.

In some examples, the image stack of the image sensor structure includes a substrate layer, a plurality of isolation trenches and a dielectric material. The substrate layer is disposed over the plurality of light detectors. The substrate layer is operative to pass emissive light and excitation light. The plurality of isolation trenches are disposed in the substrate layer. Each isolation trench is disposed adjacent a light detector in the plurality of light detectors. The dielectric material is disposed in each isolation trench. The dielectric material is operative to electrically isolate each light detector in the plurality of light detectors.

In some examples of the image sensor structure, the intermediate layer disposed in the first optical filter stack and the substrate layer of the image stack are comprised of the same material.

In some examples of the image sensor structure, the intermediate layer and the substrate layer are comprised of silicon.

In some examples the image sensor structure includes the light guide layer being comprised of an optically absorptive material. An optically transparent material is disposed in the light pipe cavities. The optically transparent material has an index of refraction that is greater than an index of refraction of the optically absorptive material.

In some examples, the image sensor structure includes a crosstalk layer, a crosstalk curtain, a diffusion layer and a light pipe extension. The crosstalk layer is disposed over a top surface of the optical filter stack, between one or more of the light pipe cavities. The crosstalk curtain extends down from the top surface of the optical filter stack, between one or more of the light pipe cavities. The diffusion layer is disposed between the optical filter stack and the image stack. The light pipe extension is disposed at the bottom of one or more of the light pipe cavities. The light pipe extension extends through the diffusion layer.

Another image sensor structure in accordance with one or more aspects of the present disclosure includes an image stack disposed over a device stack. The image stack includes a plurality of light detectors. A first optical filter stack is disposed over the image stack. The first optical filter stack includes a light guide layer, a plurality of light pipe cavities disposed in the light guide layer and optical filter material disposed in the light pipe cavities. Each light pipe cavity is associated with a light detector in the plurality of light detectors. The optical filter material is in direct contact with the light guide layer at sidewalls of the light pipe cavities. A nanowell layer is disposed over the first optical filter stack. A plurality of nanowells is disposed in the nanowell layer. Each nanowell is associated with a light detector in the plurality of light detectors.

In some examples of the image sensor structure, the light pipe cavities have an aspect ratio that is greater than about 2.5 to about 1.

In some examples of the image sensor structure, the light pipe cavities have a sidewall angle that is within the range of about 11 to about 1.2 degrees.

In some examples of the image sensor structure the light guide layer includes one of a polymer material, a semiconductor material and a dielectric material.

In some examples of the image sensor structure, the first optical filter stack includes an intermediate layer disposed over the image stack. The light guide layer is disposed over the intermediate layer. The light guide layer is a metal layer that is disposed on the sidewalls of the light pipe cavities and is not disposed on the bottom surface of the light pipe cavities. The light guide layer has a thickness of about 100 nanometers or less.

In some examples of the image sensor structure the image stack includes a substrate layer, a plurality of isolation trenches and a dielectric material. The substrate layer is disposed over the plurality of light detectors. The substrate layer is operative to pass emissive light and excitation light. The plurality of isolation trenches are disposed in the substrate layer. Each isolation trench is disposed adjacent a light detector in the plurality of light detectors. The dielectric material is disposed in each isolation trench. The dielectric material is operative to electrically isolate each light detector in the plurality of light detectors.

In some examples of the image sensor structure the intermediate layer disposed in the first optical filter stack and the substrate layer disposed in the image stack are comprised of the same material.

In some examples, the image sensor structure includes a second optical filter stack disposed over the first optical filter stack. The first and second optical filter stacks have an overall aspect ratio that is greater than either one of the first filter stack and the second filter stack.

In some examples, the image sensor structure incudes a crosstalk layer, a crosstalk curtain, a diffusion layer and a light pipe extension. The crosstalk layer is disposed over a top surface of the optical filter stack, between one or more of the light pipe cavities. The crosstalk curtain extends down from the top surface of the optical filter stack, between one or more of the light pipe cavities. The diffusion layer is disposed between the optical filter stack and the image stack. The light pipe extension is dispose at a bottom of one or more of the light pipe cavities. The light pipe extension extends through the diffusion layer.

Another image sensor structure in accordance with one or more aspects of the present disclosure includes an image stack disposed over a device stack. The image stack includes a plurality of light detectors. A first optical filter stack is disposed over the image stack. The first optical filter stack includes a light guide layer composed of optically absorptive material, a plurality of light pipe cavities disposed in the light guide layer and optically transparent material disposed in the light pipe cavities. Each light pipe cavity is associated with a light detector in the plurality of light detectors. The optically transparent material has an index of refraction that is greater than an index of refraction of the optically absorptive material. A nanowell layer is disposed over the first optical filter stack. A plurality of nanowells are disposed in the nanowell layer. Each nanowell is associated with a light detector in the plurality of light detectors.

In some examples of the image sensor structure, the light pipe cavities have a sidewall angle that is within the range of about 11 to about 1.2 degrees and an aspect ratio that is greater than about 2.5 to about 1.

In some examples of the image sensor structure, the optically absorptive material is in direct contact with the optically transparent material at sidewalls of the light pipe cavities.

In some examples, the image sensor structure includes a crosstalk layer, a crosstalk curtain, a diffusion layer and a light pipe extension. The crosstalk layer is disposed over a top surface of the optical filter stack, between one or more of the light pipe cavities. The crosstalk curtain extends down from the top surface of the optical filter stack, between one or more of the light pipe cavities. The diffusion layer is disposed between the optical filter stack and the image stack. The light pipe extension is dispose at the bottom of one or more of the light pipe cavities. The light pipe extension extends through the diffusion layer.

A method of forming an image sensor structure in accordance with one or more aspects of the present disclosure includes disposing an image stack over a device stack. The image stack includes a plurality of light detectors. A light guide layer is disposed over the image stack. A plurality of light pipe cavities are etched in the light guide layer. Each light pipe cavity is associated with a light detector in the plurality of light detectors. Each light pipe cavity has an aspect ratio that is greater than about 2.5 to 1. A nanowell layer is disposed over the light guide layer. A plurality of nanowells is disposed in the nanowell layer. Each nanowell is associated with a light detector in the plurality of light detectors. The light guide layer, the plurality of light pipe cavities and the optical filter material comprise a first optical filter stack disposed over the image stack.

In some examples, the method includes disposing an intermediate layer over the image stack. The light guide layer is disposed over the intermediate layer. The light guide layer is a metal layer that is disposed on the sidewalls of the light pipe cavities and is not disposed on the bottom surface of the light pipe cavities. The light guide layer has a thickness of about 100 nanometer or less.

In some examples, the method includes disposing an optical filter material in the light pipe cavities. The optical filter material is in direct contact with the light guide layer at sidewalls of the light pipe cavities.

In some examples, the method includes disposing a second optical filter stack over the first optical filter stack. The first and second optical filter stacks have an overall aspect ratio that is greater than either one of the first filter stack and the second filter stack.

In some examples, the method includes the light guide layer being comprised of an optically absorptive material. An optically transparent material is disposed in the light pipe cavities. The optically transparent material has an index of refraction that is greater than an index of refraction of the optically absorptive material.

It should be appreciated that all combinations of the foregoing concepts and additional concepts discussed in greater detail below (provided such concepts are not mutually inconsistent) are contemplated as being part of the inventive subject matter disclosed herein and may be used to achieve the benefits and advantages described herein.

DRAWINGS

The disclosure will be more fully understood from the following detailed description taken in conjunction with the accompanying drawings, in which.

Figure 8:
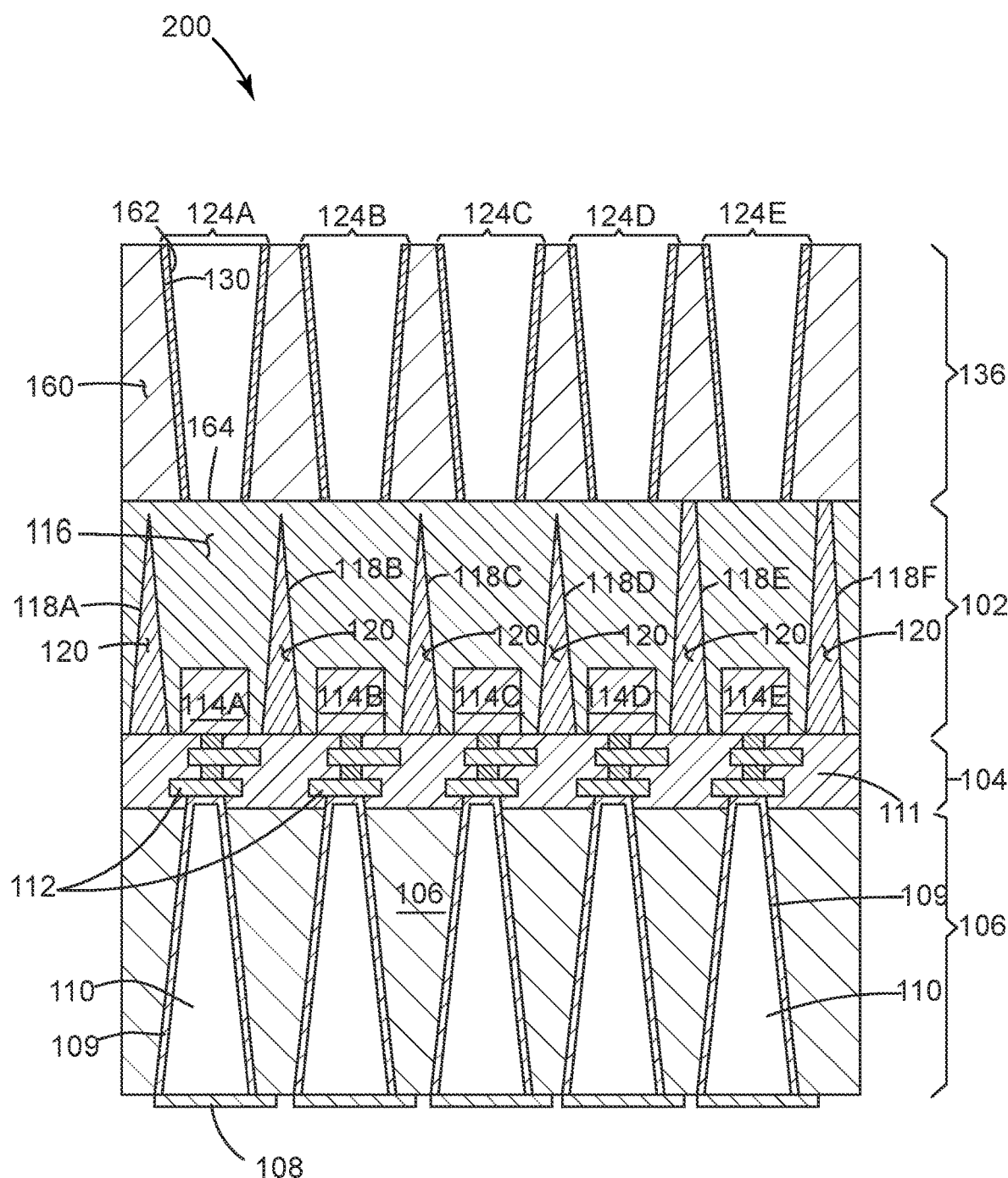
FIG. 8 depicts a cross sectional view of an example of an image sensor structure at an intermediate stage of manufacture, wherein a plurality of light pipe cavities is etched into an intermediate layer and a metal light guide layer is disposed on sidewalls of the light pipe cavities, according to aspects described herein.
Figure 9:
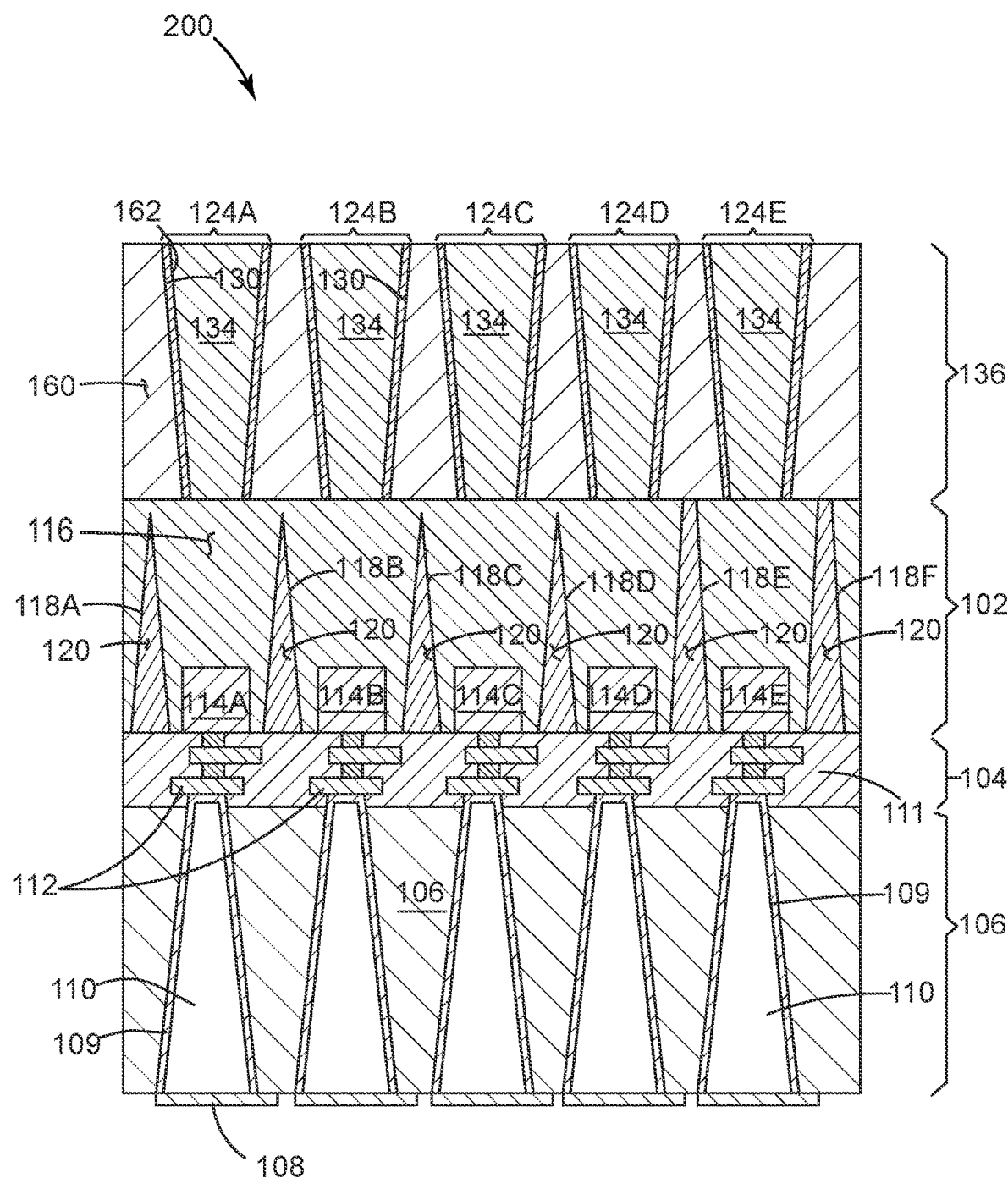
Figure 10:
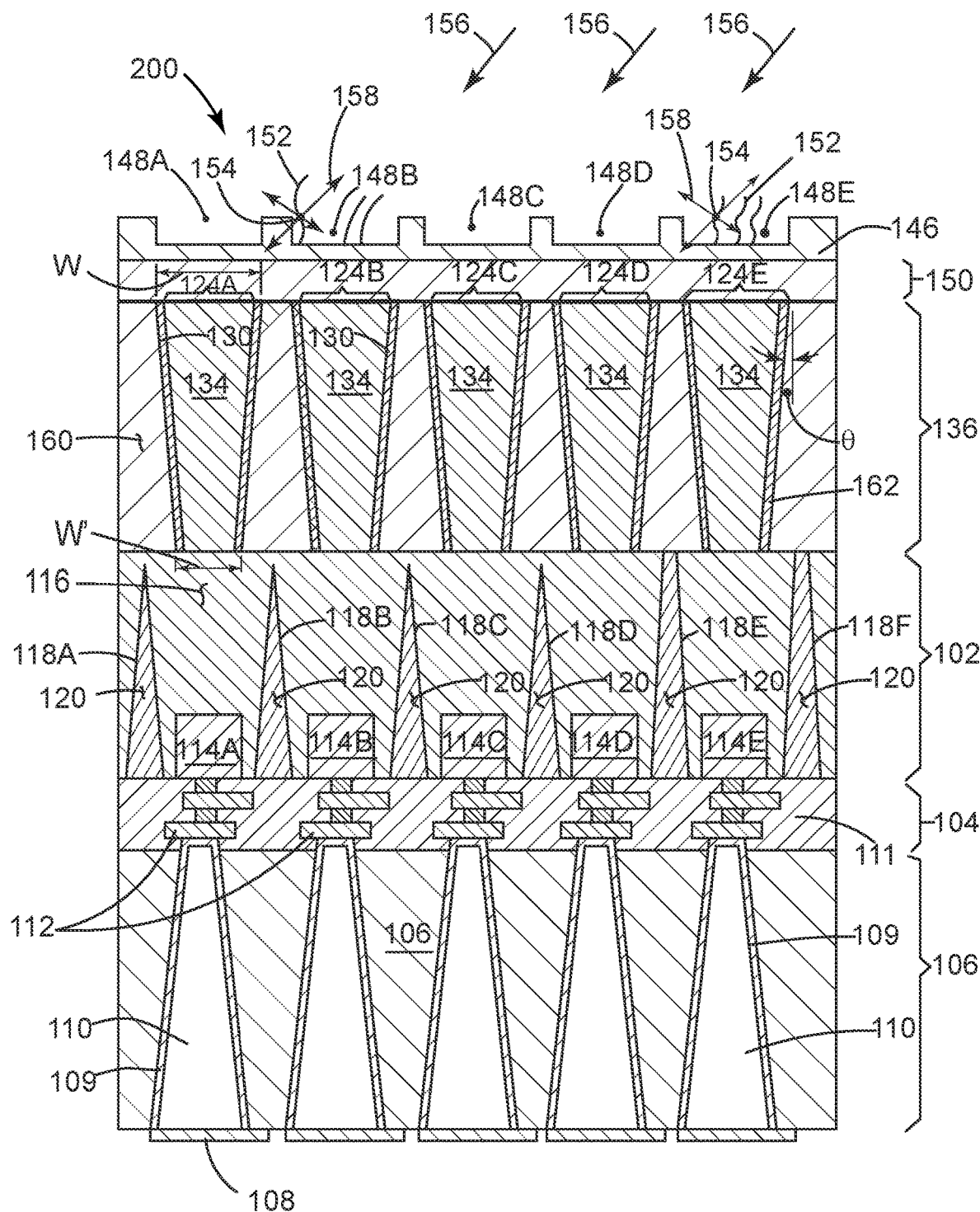
Figure 11:
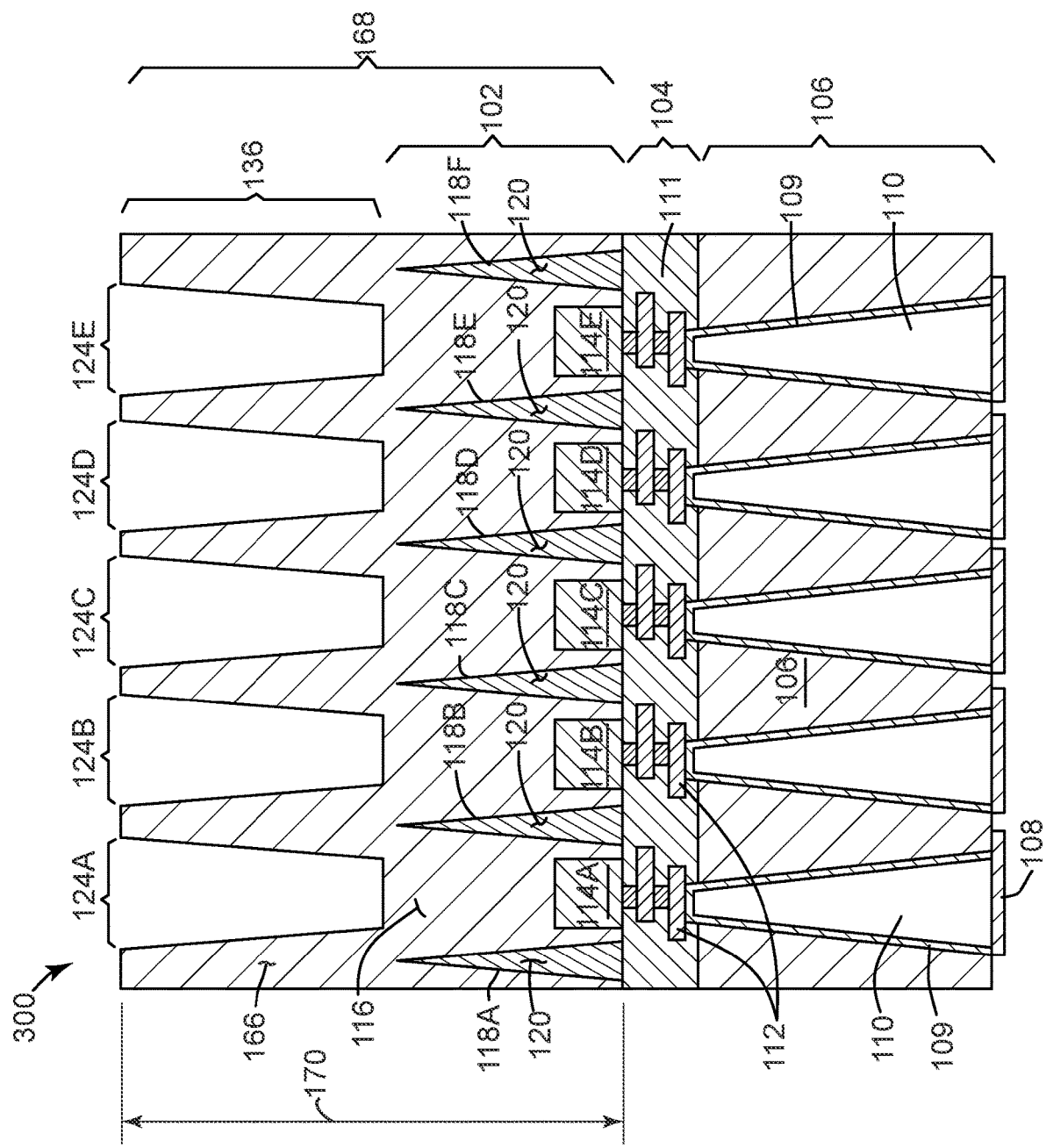
Figure 12:
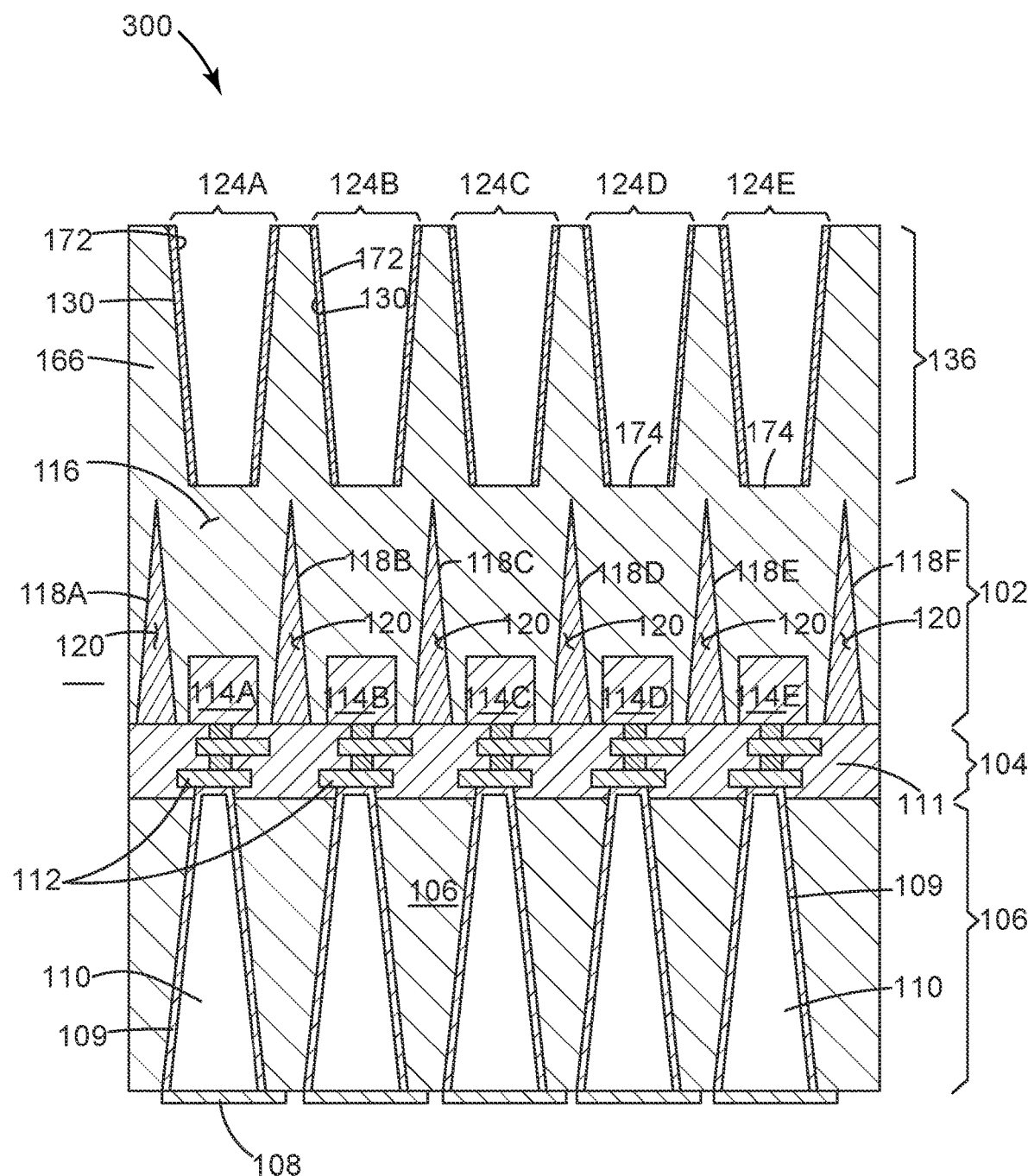
Figure 13:
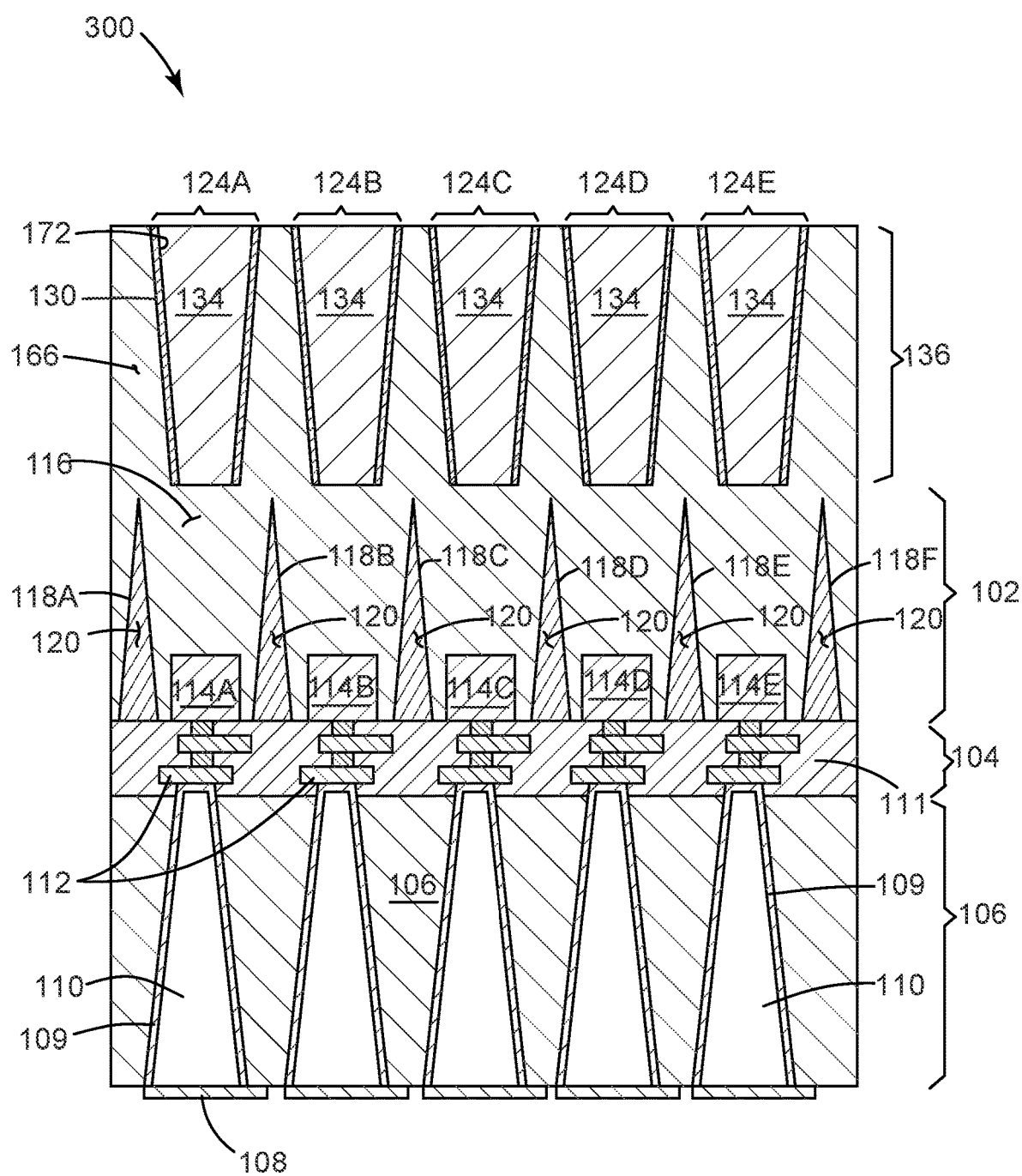
Figure 14:
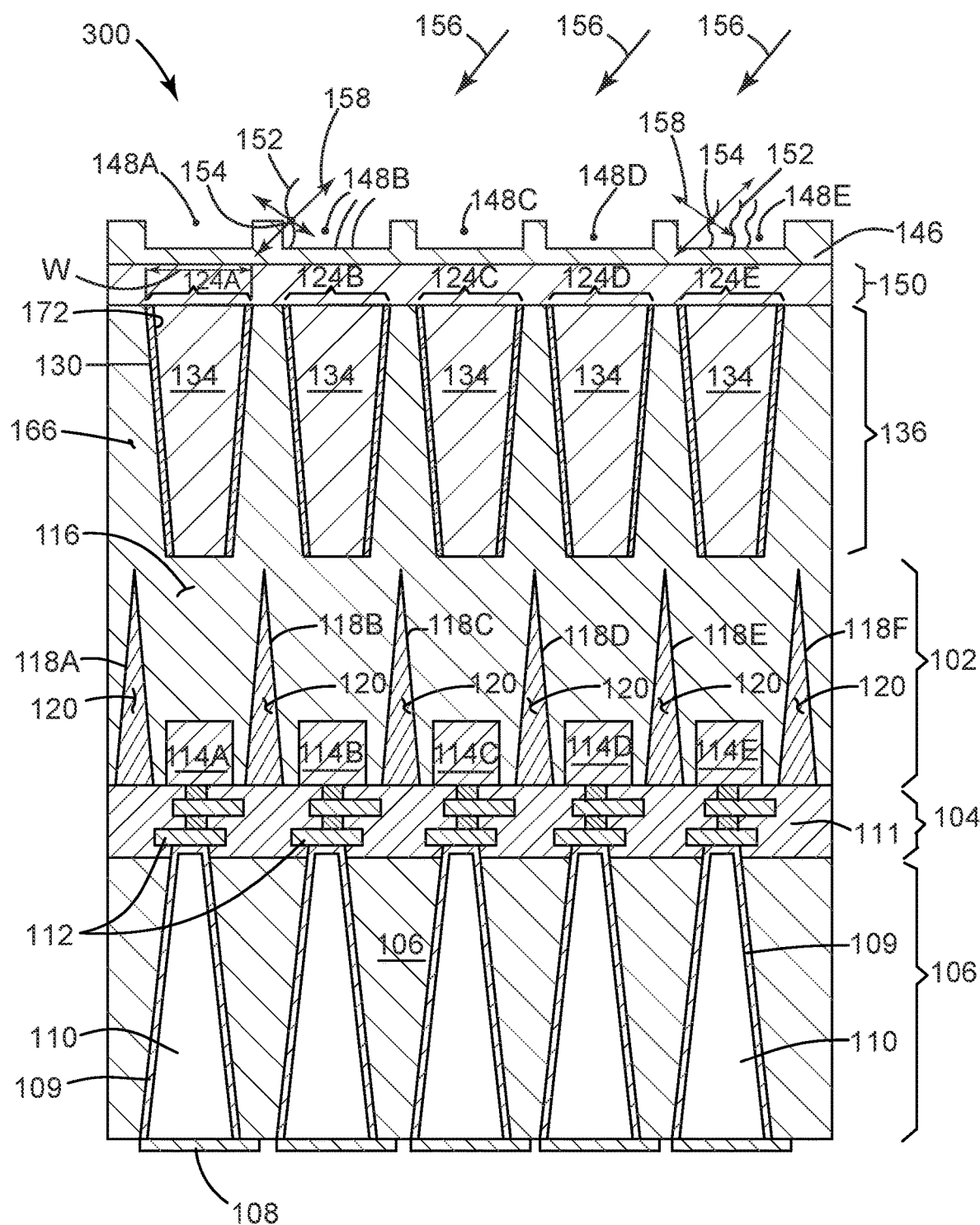
Figure 15:
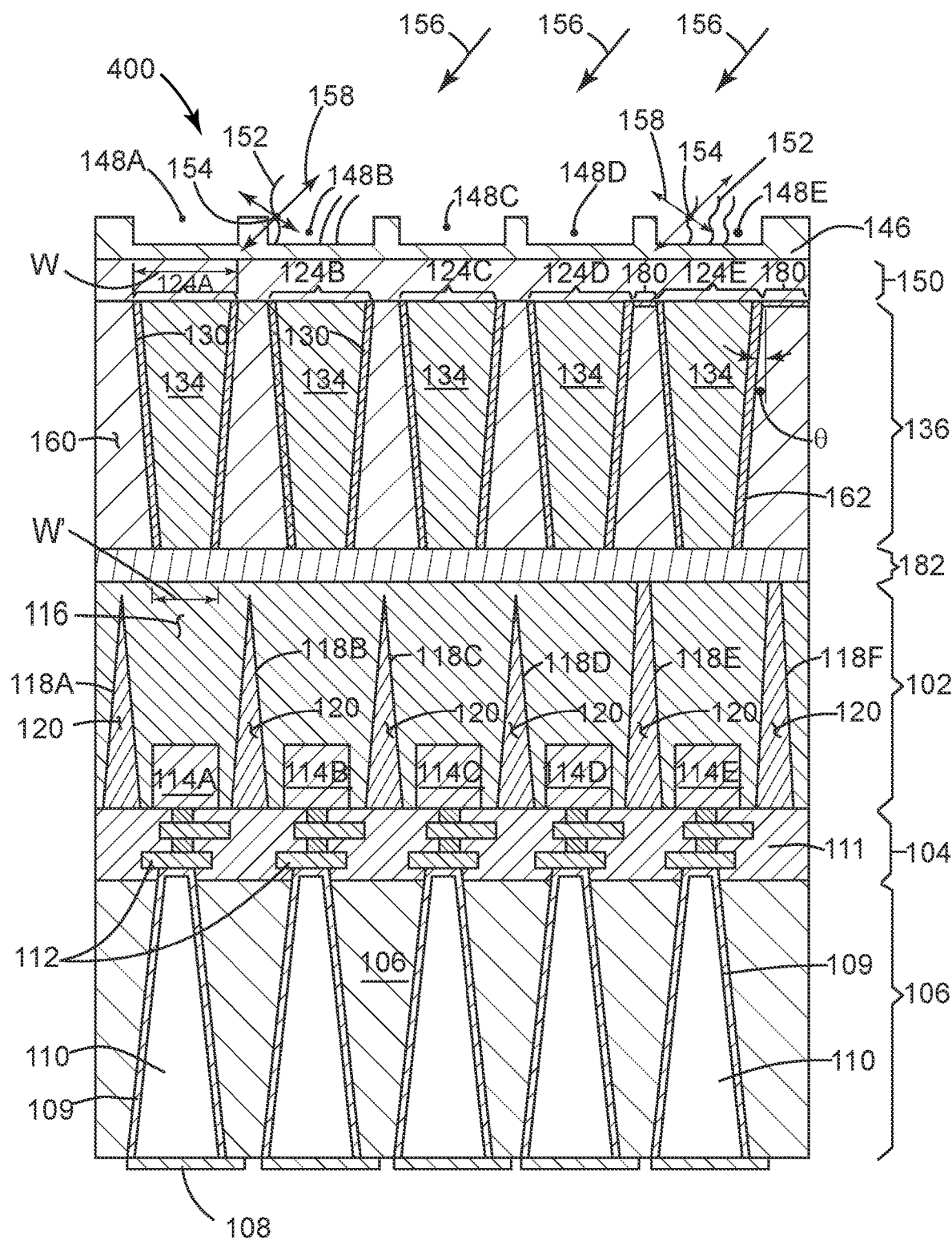
Figure 16:
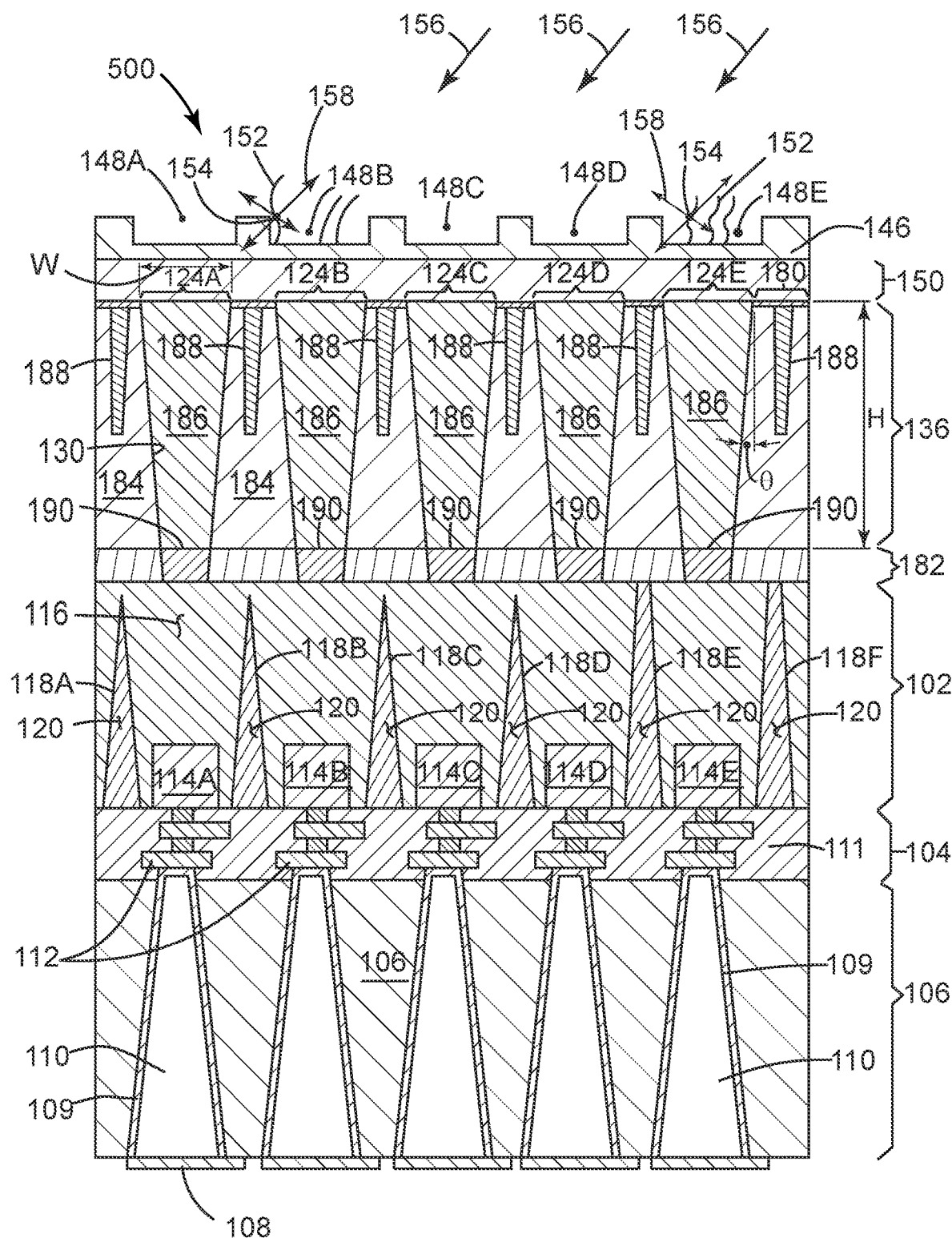

FIG. 9 depicts a cross sectional view of an example of the image sensor structure of FIG. 8 at an intermediate stage of manufacture, wherein optical filter material is disposed in the light pipe cavities and wherein the intermediate layer, the light guide layer, the plurality of light pipe cavities and the optical filter material form a first optical filter stack, according to aspects described herein;

FIG. 10 depicts a cross sectional view of an example of the image sensor structure of FIG. 9 at a completed stage of manufacture, wherein a nanowell layer having a plurality of nanowells is disposed over the first optical filter stack, according to aspects described herein;

FIG. 11 depicts a cross sectional view of an example of an image sensor structure at an intermediate stage of manufacture, wherein an intermediate layer is disposed over a substrate layer of an image stack, wherein the intermediate layer and substrate layer are comprised of the same material, and wherein a plurality of light pipe cavities is etched into the intermediate layer, according to aspects described herein;

FIG. 12 depicts a cross sectional view of an example of the image sensor structure of FIG. 11 at an intermediate stage of manufacture, wherein a metal light guide layer is disposed on sidewalls of the light pipe cavities, according to aspects described herein;

FIG. 13 depicts a cross sectional view of an example of the image sensor structure of FIG. 12 at an intermediate stage of manufacture, wherein optical filter material is disposed in the light pipe cavities and wherein the intermediate layer, the light guide layer, the plurality of light pipe cavities and the optical filter material form a first optical filter stack, according to aspects described herein;

FIG. 14 depicts a cross sectional view of an example of the image sensor structure of FIG. 13 at a completed stage of manufacture, wherein a nanowell layer having a plurality of nanowells is disposed over the first optical filter stack, according to aspects described herein;

FIG. 15 depicts a cross sectional view of an example of another image sensor structure 400 at a completed stage of manufacture, wherein a diffusion layer is disposed between an image stack and an optical filter stack, according to aspects described herein; and FIG. 16 depicts a cross sectional view of an example of another image sensor structure 500 at a completed stage of manufacture, wherein a light guide layer is comprised of an optical filter material and light pipe cavities are filled with an optically transparent material, according to aspects described herein.

DETAILED DESCRIPTION

Certain examples will now be described to provide an overall understanding of the principles of the structure, function, manufacture, and use of the methods, systems, and devices disclosed herein. One or more examples are illustrated in the accompanying drawings. Those skilled in the art will understand that the methods, systems, and devices specifically described herein and illustrated in the accompanying drawings are non-limiting examples and that the scope of the present disclosure is defined solely by the claims. The features illustrated or described in connection with one example may be combined with the features of other examples. Such modifications and variations are intended to be included within the scope of the present disclosure.

The terms "substantially", "approximately", "about", "relatively," or other such similar terms that may be used throughout this disclosure, including the claims, are used to describe and account for small fluctuations, such as due to variations in processing from a reference or parameter. Such small fluctuations include a zero fluctuation from the reference or parameter as well. For example, they can refer to less than or equal to ±10%, such as less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Referring to FIGS. 1-16, like reference numerals are used to indicate like or analogous components throughout the several views. FIGS. 1-6, 8-9 and 11-13 illustrate examples of image sensor structures 100, 200 and 300 respectively at various intermediate stages of manufacturing according to aspects described herein. FIGS. 7, 10, 14, 15 and 16 illustrate examples of the image sensor structures 100, 200, 300, 400 and 500 respectively at completed stages of manufacture.

Figure 1:
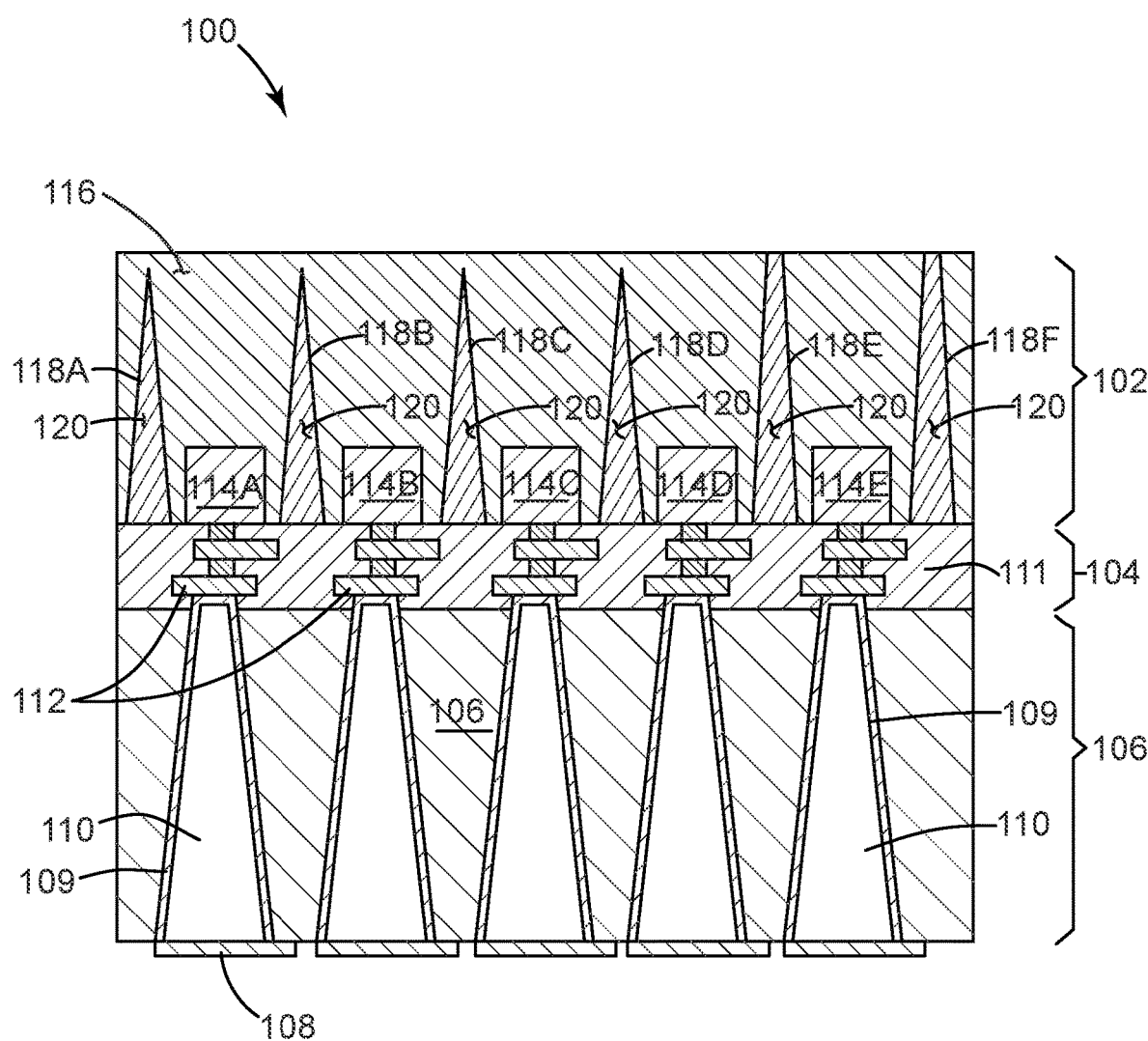
FIG. 1 depicts a cross sectional view of an example of an image sensor structure at an intermediate stage of manufacture, wherein an image stack that includes a plurality of light detectors is disposed over a device stack, according to aspects described herein.

Referring to FIG. 1, a cross sectional view of an example of an image sensor structure 100 at an intermediate stage of manufacture is depicted according to aspects described herein. At this stage of manufacture, image sensor structure 100 includes an image stack 102 disposed over a device stack 104. As will be discussed in greater detail herein, the image sensor structure 100 is a back side illuminated (BSI) image sensor structure.

To provide mechanical support for the image sensor structure 100, a carrier substrate 106 is bonded to the device stack 104. The carrier substrate 106 may comprise or be silicon or another semiconductor material. The carrier substrate 106 may be within the range of 400 to 800 microns thick.

Electrical input/output connections from the device stack 104 to conductive pads 108 bonded on the front side of the carrier substrate 106 may be made utilizing through silicon via (TSV) 110. The TSV may have a metal liner 109 or be filled with metal such as tungsten (W), aluminum (Al) or copper (Cu).

The device stack 104 may contain a plurality of dielectric layers 111. The dielectric layers 111 may comprise or be $SiO_2$, SiN, SiON or other dielectric material.

The dielectric layers 111 may contain various device circuitry 112, such as, for example resistors, capacitors, diodes and/or transistors and their interconnects. The device circuitry 112 of the device stack 104 interfaces with a plurality of light detectors 114 A, B, C, D, E (collectively 114) disposed in the image stack 102. The device circuitry 112 is operable to process data signals from the light detectors 114 using detected light photons of an emissive light 158 (best seen in FIG. 7).

A light detector 114 as used herein may be, for example, a semiconductor. The semiconductor may comprise photodiode, a complementary metal oxide semiconductor (CMOS) material, or both. The light detectors 114 may also be a photodiode junction area or implant in a semiconductor material. For example, the photodiode 114 may be an n-doped region in a p-substrate, an n-doped region on a p-well on an n-doped substrate, or any other diode combination.

The image stack 102 includes the plurality of light detectors 114 disposed over the device stack 104. A substrate layer 116 is disposed over the plurality of light detectors 114. The substrate layer 116 may comprise, or be, silicon, silicon germanium, gallium arsenide or other semiconductor material. As will be explained in greater detail herein, the substrate layer 116 is operative to pass both emissive light 158 and excitation light 156 emanating from nanowells 148 that are disposed above the image stack 102 (best seen in FIG. 7). The emissive light 158 may be, for example, in the range of wavelengths of about 500 nanometers (nm) to about 650 nm. The excitation light 156 may be, for example, in the range of wavelengths of about 400 nm to about 570 nm. The emissive light 158 may have a wavelength greater than the excitation light 156. More specifically, the emissive light 158 may have a wavelength that is within a range of about between 40 nm to 140 nm greater than the wavelength of the excitation light 156.

The image stack 102 also includes a plurality of isolation trenches 118 A, B, C, D and E (collectively 118) that are disposed in the substrate layer 116. Each isolation trench 118 is disposed adjacent a light detector 114 in the plurality of light detectors 114. The isolation trenches 118 may be deep trenches and may include large aspect ratios AR of from about from 5 to 1 to about 25 to 1. The aspect ratio AR as used herein is the ratio of the height of a feature (in this case the isolation trenches 118) to the maximum width of the feature.

Due to manufacturing tolerances, the isolation trenches 118 may not all have the same height. For example, the isolation trenches 118 A-D are illustrated as not extending across the full thickness of the substrate layer 116, and the isolation trenches 118 E-F are illustrated as extending across the entire thickness of the substrate layer 116.

The image stack 102 also includes dielectric material 120 disposed in each isolation trench 118. The dielectric material 118 is operative to electrically isolate each light detector 114 in the plurality of light detectors 114. The dielectric material 118 is also operative to significantly reduce crosstalk between light detectors by blocking or significantly reducing the transmission of light, or photo-generated electrons, between light detectors 114. The dielectric material may comprise or be $SiO_2$, SiN, SiON or other dielectric material.

An example of a method of making the image sensor structure 100 at the intermediate stage of manufacture illustrated in FIG. 1 may include first providing the substrate layer 116. Thereafter various doping techniques can be utilized to form n-doped and p-doped photodiode junction areas in the substrate layer 116 in order to form the light detectors 114. The isolation trenches 118 can then be anisotropically etched (for example with a reactive ion etching (RIE) process) between the light detectors 114. The isolation trenches 118 may then be filled with the dielectric material 120 in order to provide electrical deep trench isolation (DTI) and to significantly reduce crosstalk between the light detectors 114. Any excess of dielectric material 120 can be planarized down to the level of the light detectors 114 by, for example, a chemical mechanical planarization (CMP) process. The device stack 104 can then be disposed directly over the light detectors 114 to complete the formation of the image stack 102 and the device stack 104 of the image sensor structure 100. The carrier substrate 106 can then be bonded to the device stack 104 to provide mechanical support to the image sensor structure 100.

Figure 2:
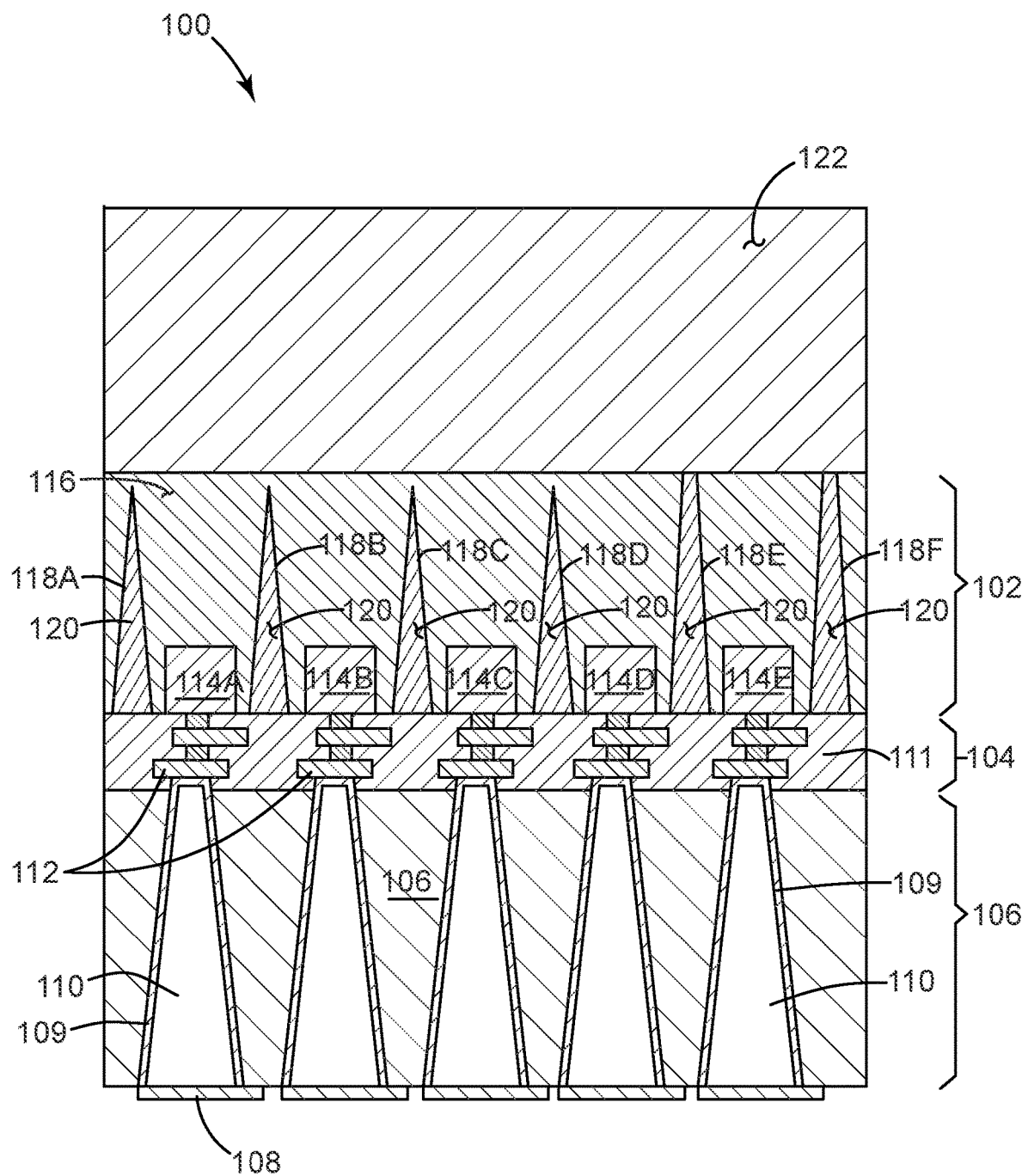
FIG. 2 depicts a cross sectional view of an example of the image sensor structure of FIG. 1 at an intermediate stage of manufacture, wherein a light guide layer is disposed over the image stack, according to aspects described herein.

Referring to FIG. 2, a cross sectional view of an example of the image sensor structure 100 of FIG. 1 at an intermediate stage of manufacture is depicted, wherein a light guide layer 122 is disposed over the image stack 102, according to aspects described herein. The light guide layer 122 may comprise or be, for example, a polymer material, a semiconductor material or a dielectric material. If the light guide layer is a polymer, it may comprise or be an SU-8 photoresist material, benzocyclobuten (BCB), a polyamide, a polymethyl methacrylate (PMMA) or other dye colored film. If the light guide layer is a dielectric, it may comprise or be $SiO_2$, SiN, SiC, silicon oxynitride or other dielectric. If it is a semiconductor material, it may comprise or be silicon or other semiconductor material.

Figure 3:
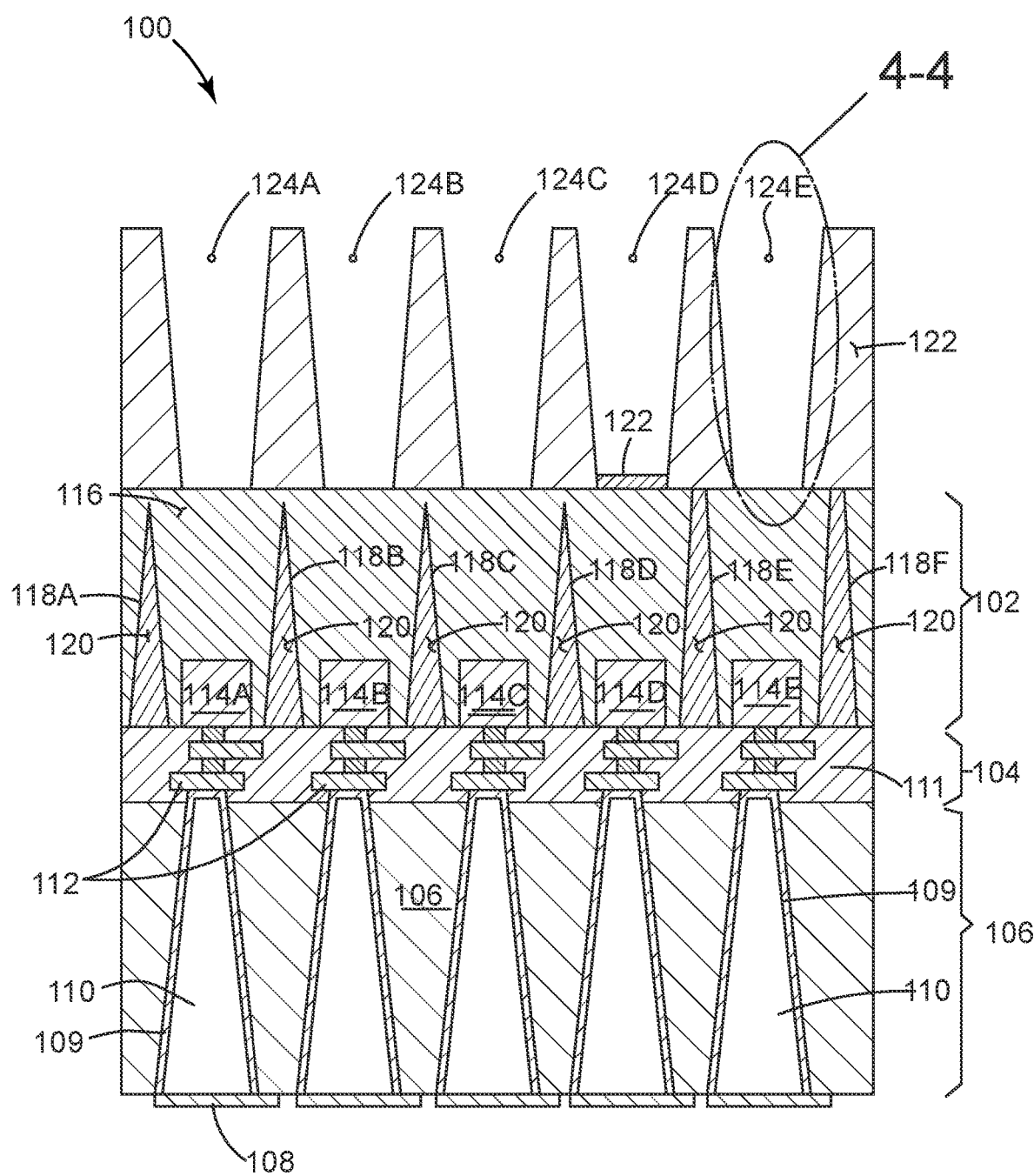
FIG. 3 depicts a cross sectional view of an example of the image sensor structure of FIG. 2 at an intermediate stage of manufacture, wherein a plurality of light pipe cavities is etched into the light guide layer such that each light pipe cavity is associated with a light detector in the plurality of light detectors, according to aspects described herein.

Referring to FIG. 3, a cross sectional view of an example of the image sensor structure 100 of FIG. 2 at an intermediate stage of manufacture is depicted, wherein a plurality of light pipe cavities 124 A, B, C, D, E (collectively 124) are formed into the light guide layer 122 according to aspects described herein. Each light pipe cavity 124 is associated with a light detector 114 in the plurality of light detectors 114. More specifically, each light pipe cavity 124 A, B, C, D, E is aligned with an associated light detector 114 A, B, C, D, E respectively. Accordingly, light traveling through the light pipe cavities 124 may be directed onto its associated light detector 114 and not onto any unassociated light detectors.

The light pipe cavities 124 may be anisotropically etched and/or lithographically patterned into the light guide layer 122. Due to manufacturing tolerances, the light pipe cavities 124 may not always penetrate the entire thickness of the light guide layer 122. For example, the light pipe cavity 124 D is illustrated as having a small thickness of the light guide layer 122 material disposed at the bottom of light pipe cavities. However, the thickness of the light guide layer 122 at the bottom of light pipe cavity 124 D is small enough that it does not significantly block light being directed toward the light sensors 114. In order to not significantly block light, the thickness of the light guide layers 122 at the bottom of the light pipe cavities 124 may be about 50 nanometers thick or less, or may be about 20 nanometers thick or less.

The light guide layer 122 significantly reduces or blocks the transmission of light from one light pipe cavity 124 to another to aid in the reduction of crosstalk between light detectors 114. The term "significant" herein may refer to greater than or equal to about 50%. For example, the light guide layer 122 may reduce the transmission of light from one light pipe cavity 124 to another by 50 percent, by 60 percent, by 75 percent or more. The light guide layer 122 also aids in guiding a significant portion of emissive light 156 through the light pipe cavity 124 and onto its associated light detector 114. For example, the light guide layer may aid in guiding 50 percent, 60 percent, 75 percent of more of the emissive light 156 onto its associated light detector 114.

Figure 4:
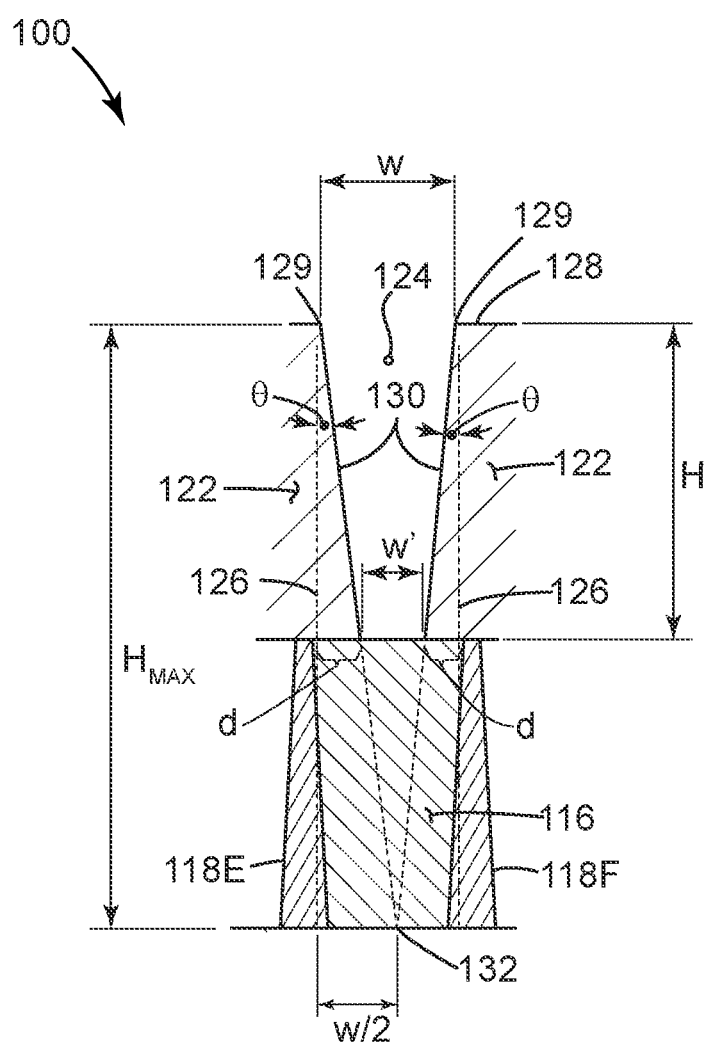
FIG. 4 depicts a cross sectional view of an example of an enlarged view of the circular area 4-4 of FIG. 3, wherein an aspect ratio and sidewall angles of the light pipe cavities are illustrated, according to aspects described herein.

Referring to FIG. 4, an enlarged cross sectional view of an example of the circular area 4-4 of FIG. 3 is depicted, wherein an aspect ratio AR and sidewall angles θ of the light pipe cavities 124 are illustrated, according to aspects described herein. As will be explained in more detail herein, the aspect ratio AR of the light pipe cavities 124 may range from about 2.5 to 1 to about 25 to 1 depending on the need to block excitation light and to collect emissive light that emanates from nanowells 148 disposed directly above the light pipe cavities 124 in the image sensor structure 100. More specifically, the aspect ratio AR of the light pipe cavities 124 of FIGS. 3 and 4 is the ratio of the actual height H of the light pipe cavity 124 to the maximum width W, which happens to be the top width W at the top of the light pipe cavity 124.

It may not be practical or cost effective to reliably manufacture such high aspect ratio light pipe cavities 124 wherein the bottom width W' at the bottom of the cavity 124 is equal to the top width W at the top of the cavity 124. In other words, a reliable and cost effective manufacturing process for these high aspect ratio light pipe cavities 124 may more than likely include sidewalls 130 having a non-zero sidewall angle θ relative to a vertical reference line 126 (i.e., a line 126 that is substantially perpendicular to the top surface 128 of the light guide layer 122).

The sidewall angles θ on either side of the light pipe cavities 124 are more than likely substantially equal. Therefore, the horizontal distances d (on either side of the light pipe cavities 124) of the bottom width W' from vertical reference lines 126 extending downward from the top edges 129 of the cavity 124 may also be substantially equal.

Such non-zero sidewall angles θ will limit the maximum attainable height Hmax, and therefore the maximum attainable aspect ratio ARmax, that the light pipe cavities 124 can attain for any given sidewall angle θ. That is, the maximum attainable height Hmax is limited to the height at which the bottom width W' at the bottom of the light pipe cavity 124 may become zero. In other words, the maximum attainable height Hmax is limited to the height at which the sidewalls 130 may meet at a point 132 for any given sidewall angle θ. Since the sidewall angles θ on either side of the light pipe cavities 124 are substantially equal, the point 132 is positioned horizontally midway between the width W at the top of the cavities 124. Therefore, the horizontal distance of the bottom point 132 from the vertical reference line 126 may also be substantially equal W/2.

The relationships between the actual aspect ratio AR, maximum attainable aspect ratio ARmax, the actual height H, the maximum attainable height Hmax, the sidewall angle θ, the top width W, the bottom width W' and the distance d can be expressed as follows:

$AR = H/W;$ $\tan\theta = d/H = 0.5W/H\text{max};$ and $AR\text{max} = H\text{max}/W = H/(2d) = H/(W-W') = 0.5/(\tan\theta).$ Accordingly, since ARmax=0.5/(tan θ), the smaller the sidewall angle θ, the larger the maximum attainable aspect ratio ARmax that can be attained.

Figure 5:
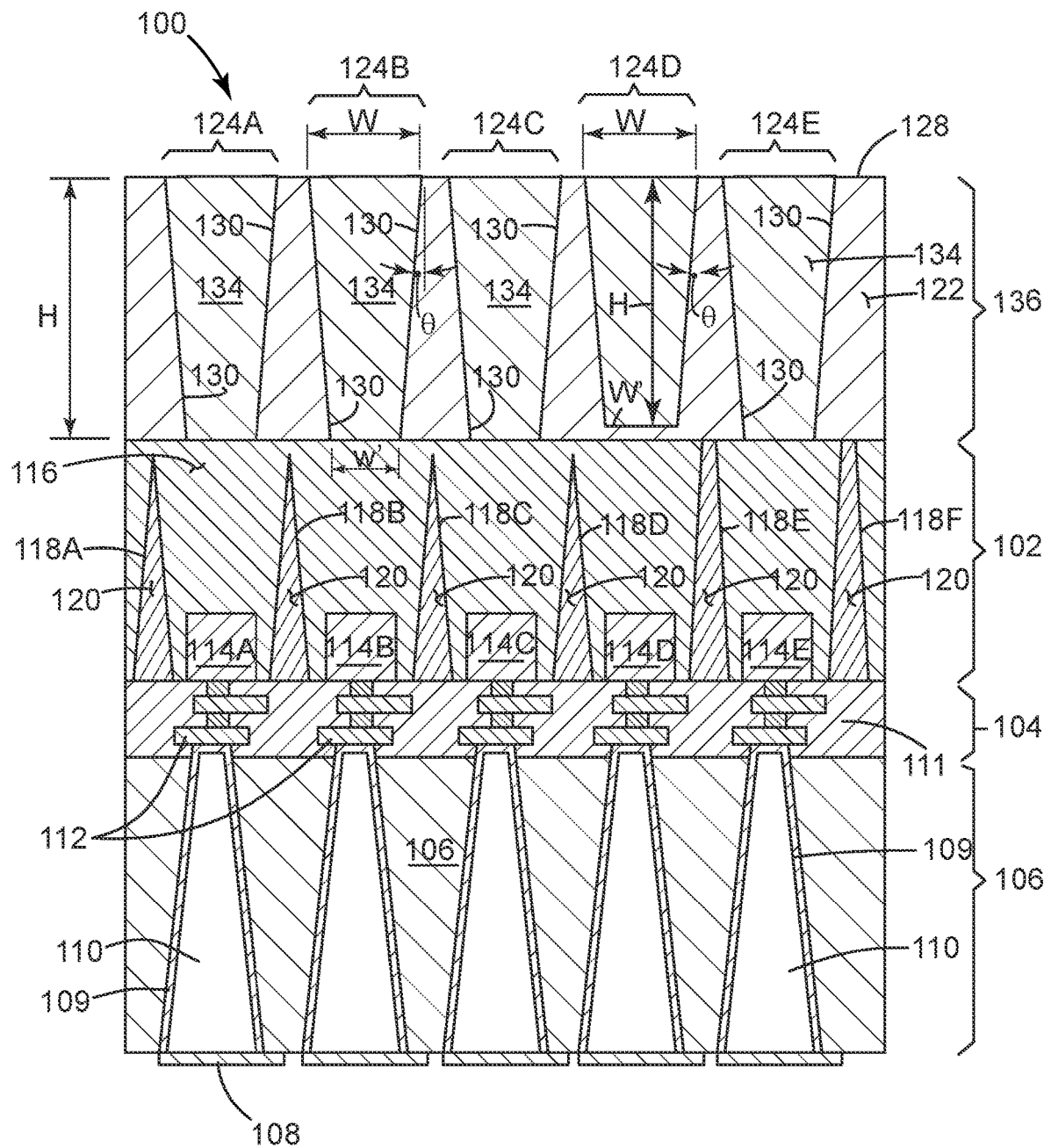
FIG. 5 depicts a cross sectional view of an example of the image sensor structure of FIG. 3 at an intermediate stage of manufacture, wherein optical filter material is disposed in the light pipe cavities and wherein the light guide layer, the plurality of light pipe cavities and the optical filter material form a first optical filter stack, according to aspects described herein.

Referring to FIG. 5, a cross sectional view of an example of the image sensor structure 100 of FIG. 3 at an intermediate stage of manufacture is depicted, wherein an optical filter material 134 is disposed in the light pipe cavities 124 according to aspects described herein. At this stage of manufacture, the light guide layer 122, the plurality of light pipe cavities 124 and the optical filter material 134 form a completed first optical filter stack 136 that is disposed over the image stack 102.

The optical filter material 134 may block a significant portion of excitation light. For example, the optical filter material may pass a significant portion of wavelengths of emissive light in the range of about 500 nm to 650 nm and may block a significant portion of excitation light in the range of about 400 nm to 570 nm.

The optical filter material 134 is disposed in the light pipe cavities 124 such that it is in direct contact with the light guide layer 122 at the sidewalls 130 of the light pipe cavities 124. Having the optical filter material 134 in direct contact with the light guide layer 122 at the sidewalls 130 of the light pipe cavities 124 assures that no significant amount of excitation light 156 can inadvertently transmit between the optical filter material 134 and light guide layer 122 to reach the light detectors 114 below.

The optical filter material 134 may comprise or be a dye-polymer blend where the dye may have low fluorescence. For example, the dye may comprise or be a member of the metallized azo dye complex class, such as an Orasol Orange type dye, an Orasol Yellow type dye, a Solvent Yellow type dye, a Solvent Orange type dye or a Solvent Red type dye. The polymer may comprise or be, for example, a cellulose acetate butyrate.

The material 134 may be spin coated or sprayed into the light pipe cavities 124, baked and/or cured. Any excess optical filter material 134 can be planarized down to the level of the top surface 128 of the light guide layer 122.

The light pipe cavities 124 and the optical filter material 130 effectively act as light guides that block most excitation light 156 and transmit a significant portion of the emissive light 158 to the plurality of light detectors 114. In order to operate efficiently as light guides, the light pipe cavities 124 in some implementations have a height H that is tall enough to enable the selected light guide material 134 to block a substantial portion of excitation light 156 from transmitting to the light detectors 114 below.

Additionally, in order to operate efficiently as light guides, the top width W of the cavities 124 in some implementations are large enough to efficiently collect a substantial amount of emissive light 158, even when the pitch between the light detectors 114 is small, e.g. smaller than about 0.5 microns. When the pitch between light detectors 114 is small compared to the top width W, the bottom width W' of the light pipe cavities 124 may also be small compared to the top width W.

One way to enable a large height H and a large difference between the top width W and bottom width W' of the light pipe cavities is to have a high aspect ratio. For example, the aspect ratio H/W may be greater than about 2.5 to 1, may be greater than about 5 to 1, may be greater than about 10 to 1 and may be greater than about 20 to 1.

The higher the actual aspect ratio H/W may be, the higher the maximum attainable aspect ratio Hmax/W may be and the smaller the sidewall angle θ may be. For example:

for an actual aspect ratio of about 2.5 to 1, the maximum attainable aspect ratio may be about 2.5 to 1 or greater and the sidewall angle θ may be about 11 degrees or smaller;

for an actual aspect ratio of about 5 to 1, the maximum attainable aspect ratio may be about 5 to 1 or greater and the sidewall angle θ may be about 6 degrees or smaller;

for an actual aspect ratio of about 10 to 1, the maximum attainable aspect ratio may be about 10 to 1 or greater and the sidewall angle θ may be about 3 degrees or smaller; and for an actual aspect ratio of about 20 to 1, the maximum attainable aspect ratio may be about 20 to 1 or greater and the sidewall angle θ may be about 1.5 degrees or smaller.

However, high maximum attainable aspect ratios and corresponding small sidewall angles θ may be impractical, unreliable and expensive to manufacture. For example, a maximum attainable aspect ratio of about greater than 25 to 1 and a corresponding sidewall angle θ of about less than 1.2 degrees may be difficult to manufacture in significant quantities reliably.

Accordingly, to enable the reliable manufacture of light guides, i.e., light pipe cavities 124 filled with optical filter material 134, that efficiently block excitation light 156 and collect emissive light 158, the aspect ratio H/W and sidewall angles θ of the light pipe cavities may be made within certain predetermined ranges. For example the light pipe cavities may have:

an aspect ratio that is about 2.5 to 1 or greater and a sidewall angle that is within the range of about 11 degrees to about 1.2 degrees;

an aspect ratio that is about 5 to 1 or greater and a sidewall angle that is within the range of about 6 degrees to about 1.2 degrees;

an aspect ratio that is about 5 to 1 or greater and a sidewall angle that is within the range of about 6 degrees to about 1.5 degrees;

an aspect ratio that is about 10 to 1 or greater and a sidewall angle that is within the range of about 3 degrees to about 1.2 degrees; and an aspect ratio that is about 10 to 1 or greater and a sidewall angle that is within the range of about 3 to about 1.5 degrees.

Figure 6:
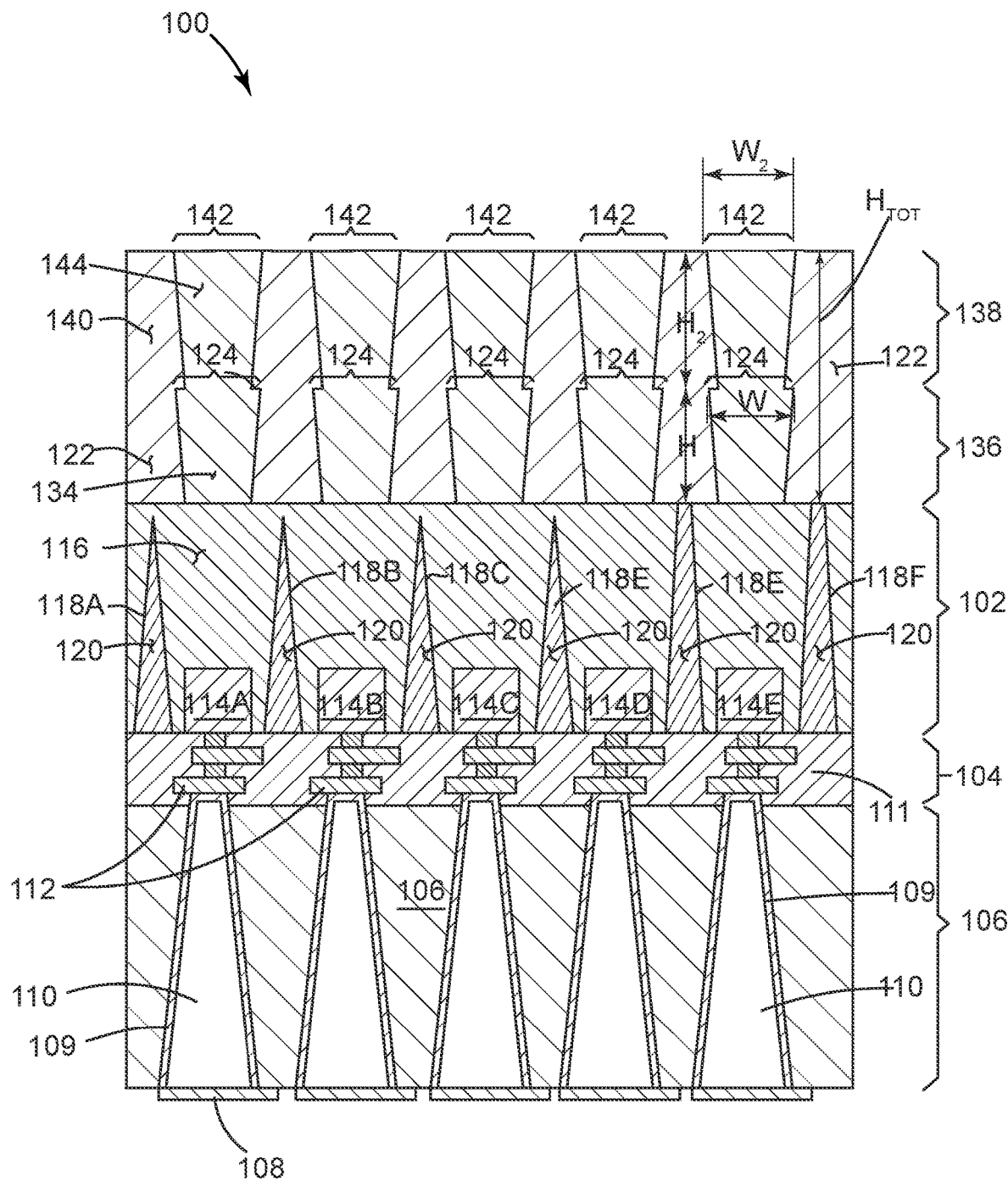
FIG. 6 depicts a cross sectional view of an example of the image sensor structure of FIG. 5 at an intermediate stage of manufacture, wherein a second optical filter stack is disposed over the first optical filter stack of FIG. 5, according to aspects described herein.

Referring to FIG. 6, a cross sectional view of an example of the image sensor structure of FIG. 5 at an intermediate stage of manufacture is depicted, wherein a second optical filter stack 138 is disposed over the first optical filter stack 136 of FIG. 5, according to aspects described herein. The combined first and second optical filter stacks 136, 138 have an overall aspect ratio that is greater than either one of the first optical filter stack and the second optical filter stack.

High aspect ratios, that may normally be difficult to reliably manufacture, may be desirable to enable such parameters as substantially blocking excitation light 156 or efficiently collecting emissive light 158. For example an overall aspect ratio of greater than about 10, greater than about 15, greater than about 20 and greater than about 25 may be desired. To achieve such high aspect ratios, yet still have sidewall angles θ within reasonable manufacturing limits, a second optical filter stack 138 may be disposed over the first optical filter stack 136. Such reasonable manufacturing limits of sidewall angles θ may be, for example, 1.2 degrees or more, 1.5 degrees or more and 3 degrees or more.

The second optical filter stack 138 may include a second light guide layer 140 disposed over the first optical filter stack 136. A second plurality of light pipe cavities 142 may be formed into the second light guide layer 140. Each second light pipe cavity is associated with a light detector 114 in the plurality of light detectors. A second optical filter material 144 may be disposed within each second light pipe cavity 142. The second light pipe cavities may have a second light pipe cavity height $H_2$ and a second light pipe cavity top width $W_2$.

The overall aspect ratio may be about equal to the overall height $H_{TOT}$ of the combined first and second light pipe cavities 124, 140 divided by the maximum width of the combined first and second light pipe cavities 124, 140. If the second optical filter stack 138 is substantially geometrically identical to the first optical filter stack 136, the overall aspect ratio may effectively be about double that of the aspect ratio of the first light pipe cavities 124 and the sidewall angles θ may stay about the same.

That is, the overall aspect ratio may be about equal to the overall height $H_{TOT}$ of the combined heights H, $H_2$ of the first and second light pipe cavities 124, 140 divided by the maximum width of the combined first and second light pipe cavities 124, 140. The maximum width may be the wider of the two top widths W, $W_2$. Since the overall height $H_{TOT}$ may be about double the height H of the first light pipe cavities 124 and the maximum width may be about equal to the width W of the first light pipe cavities, the overall aspect ratio may be about double that of the first light pipe cavities 124. However, the sidewall angles θ may remain about the same throughout the first and second light pipe cavities 124, 142.

Though the second optical filter stack 138 is illustrated in FIG. 6 to be substantially identical to the first optical filter stack 136, other configurations of the second optical filter stack 138 may be utilized. For example, the second optical filter stack 138 may differ from the first optical filter stack 136 in the material and size of the second light guide layer 140, the material and size of the second light pipe cavities 142 and the material and size of the second optical filter material.

Figure 7:
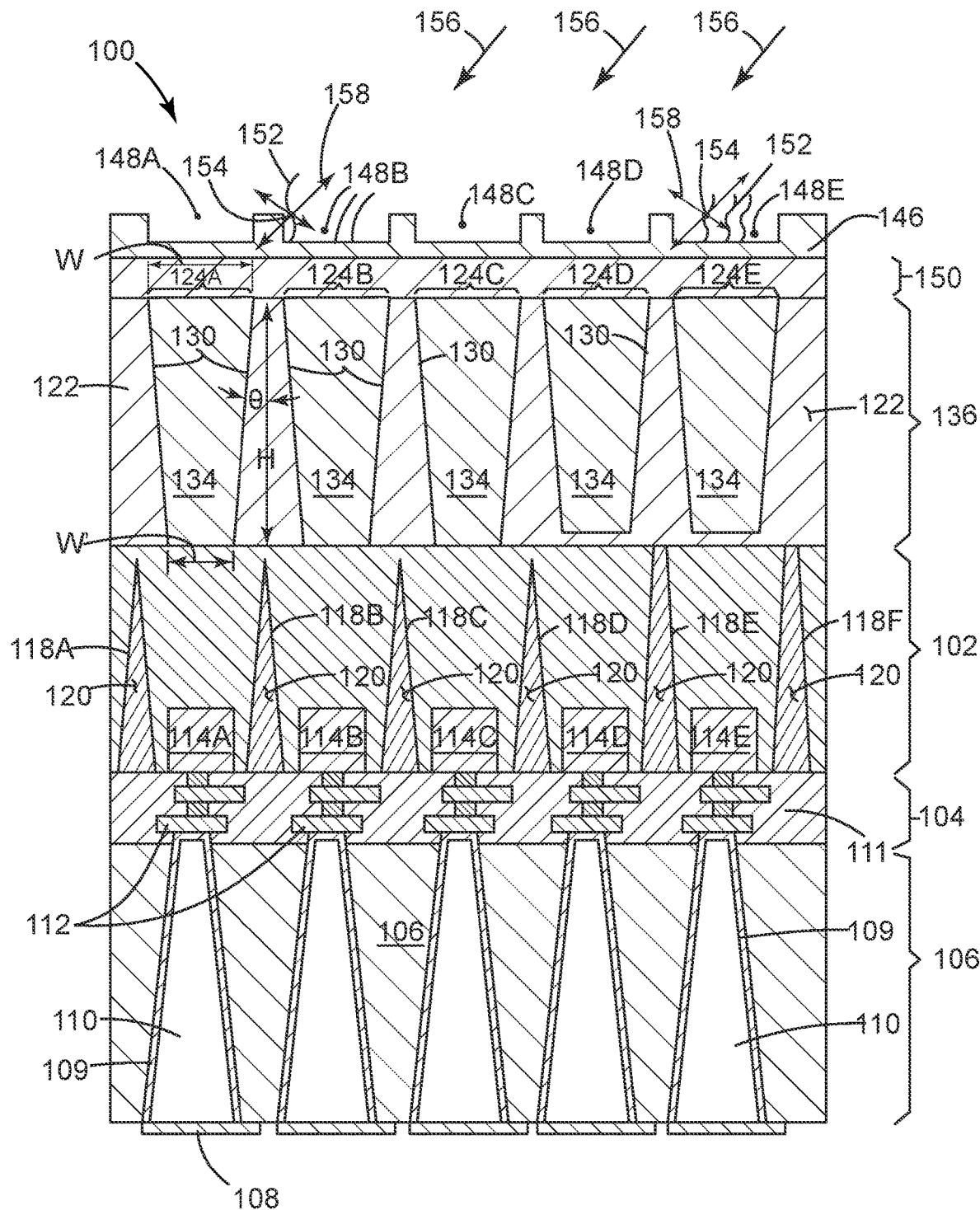
FIG. 7 depicts a cross sectional view of an example of the image sensor structure of FIG. 5 at a completed stage of manufacture, wherein a nanowell layer having a plurality of nanowells is disposed over the first optical filter stack, according to aspects described herein.

Referring to FIG. 7, a cross sectional view of an example of the image sensor structure 100 of FIG. 5 at a completed stage of manufacture is depicted, wherein a nanowell layer 146 having a plurality of nanowells 148 A, B, C, D, E (collectively 148) is disposed over the first optical filter stack 136, according to aspects described herein. Each nanowell 148 is associated with a light detector 114 in the plurality of light detectors. More specifically, each nanowell 148 A, B, C, D, E may be aligned with an associated light pipe cavity 124 A, B, C, D, E and an associated light detector 114 A, B, C, D, E respectively. Accordingly, certain light emanating from a nanowell 148 may travel through its associated the light pipe cavity 124 and may be directed onto its associated light detector 114 and not onto any unassociated light detectors.

The nanowell layer 146 may be one or more layers of a dielectric material, such as silicon nitride SiN or a type of tantalum oxide (such as tantalum pentoxide $Ta_2O_5$). The nanowells 148 may be lithographically patterned and etched into the nanowell layer 146.

A passivation stack 150 may be optionally disposed directly over the first optical filter stack 136, wherein the nanowell layer 146 may be disposed over the passivation stack. The passivation stack may be one or more layers of a dielectric material such as SiO2 or SiN. The passivation stack may also be one or more layers of a polymer, such as BCB or SU8. The passivation stack may be used to reduce the chemical reactivity of the first optical filter stack 136, with chemical reactions performed in the nanowells 148.

During operation, certain analytes 152 (such as clusters of DNA segments or the like) may be tagged with a fluorescent labeled molecule 154 and disposed in the nanowells 148. Various types of excitation light 156 may then be radiated onto the analytes 152 in the nanowells 148, causing the labeled molecules 154 to fluoresce emissive light 158. The majority of photons of emissive light 158 may be transmitted through the passivation stack 150 and enter its associate light pipe cavity 124. The light pipe cavity 124 together with its optical filter material 134, act as light guides that may filter out most of the excitation light 156 and direct a significant portion of the emissive light 158 to an associated light detector 114 located directly below the light guide.

The light detectors 114 detect the emissive light photons 158. The device circuitry 112 within the device stack 104 then processes and transmits data signals based on those detected photons of emissive light 158. The data signals may then be analyzed to reveal properties of the analytes 152.

The image sensor structure 100 is a back-side illuminated (BSI) image sensor structure because the nanowells 148 are disposed on the back side of the image sensor structure 100, and because the device stack 104 is not disposed between the nanowell layer 146 and the plurality of light detectors 114. In other words, the device stack 104 and the nanowell layer 146 are disposed on opposing sides of the plurality of light detectors 114. Therefore, the nanowells 148 are illuminated by the excitation light 156 from the back side of the image sensor structure 100.

However, because of the position of the device stack 104, the device circuitry 112 may not be available to aid in the reduction of crosstalk of emissive light photons 158 emanating from a nanowell 148 onto an unassociated light detector 114. To compensate for the lack of a device stack 104, the light guide layer 122 is utilized to block most of the emissive light 158 and excitation light 156 from transmitting from one light pipe cavity 124 to another. In other words, the light guide layer 122 is operative to prevent or at least substantially prevent emissive light 158, emitting from the fluorescently labeled molecules 154 in the nanowells 148, and excitation light 156, illuminating the nanowells 148 from the back side of the image sensor structure 100, from passing therethrough.

Additionally, the light guide layer 122 is in direct contact with the optical filter material 134 at the sidewalls 130 of the light pipe cavities 124. As such, little to no excitation light 156 can transmit through the light pipe cavities 124 without going through the optical filter material 134. The optical filter material 134 is operative to block the excitation light 156 and to pass the emissive light 158 through to the light detectors 114.

The high aspect ratio H/W of the light pipe cavities 124 geometrically shapes the optical filter material 134 filling the cavities 124. Therefore, the high aspect ratio of the light pipe cavities 124 aids in providing an adequate height H to the optical filter material 134, which enables the optical filter material 134 to block a significant portion of the excitation light 156 from passing through.

The high aspect ratio H/W of the light pipe cavities 124 also provides a significantly wider top width W relative to the bottom with W' of the light pipe cavities 124. As such, the light pipe cavities 124 may efficiently collect emissive light 158 even when the pitch between the light detectors 114 is as small as, for example, about 0.6 to 0.5 microns or less.

The high aspect ratio H/W of the light pipe cavities 124, may be as high as about 2.5 to 1, about 5 to 1, about 10 to 1, about 20 to 1 or more. Additionally, the sidewall angles θ are small enough to allow for the high aspect ratios in the light pipe cavities 124, yet not so large as to make the manufacture of the light pipe cavities unreliable and/or overly expensive. The sidewall angles θ of the light pipe cavities 124 may be within a range of about 11 degrees to about 1.2 degrees, within a range of about 10 degrees to about 1.5 degrees, within a range of about 6 degrees to about 1.2 degrees, within a range of about 3 degrees to about 1.2 degrees and within a range of about 3 degree to about 1.5 degrees.

Referring to FIG. 8, a cross sectional view of an example of another image sensor structure 200 at an intermediate stage of manufacture is depicted, wherein a plurality of light pipe cavities 124 is etched into an intermediate layer 160 and a metal light guide layer 162 is disposed on sidewalls 130 of the light pipe cavities 124, according to aspects described herein. The light guide layer 162 may comprise or be a metal, such as aluminum, gold or copper. However, if the thickness of the metal light guide layer 162 between the light pipe cavities 124 is too great, the metal may absorb too much of the emissive light 158 prior to reaching the light detectors 114. In order to not absorb too much emissive light 158, the thickness of a metal light guide layer 162 between light pipe cavities 124 may be, for example, about 100 nanometers or less, about 50 nanometers or less, or about 40 nanometers or less.

The intermediate layer 160 is disposed over the image stack 102 and provides mechanical support for the relatively thin metal light guide layer 162. The light guide layer 162 is disposed over the intermediate layer 160 on the sidewalls 130 of the light pipe cavities 124. In one implementation, the metal layer is disposed directly on the sidewalls.

The metal light guide layer 162 may not be disposed on the bottom surface 164 of the light pipe cavities 124. This is because the metal light guide layer 162, even being as thin as 100 nanometers or less, may prevent a significant portion of emissive light 158 from transmitting into the image stack 102 if it were disposed on the bottom surface 164 of the light pipe cavities 124.

The intermediate layer 160 may comprise, or be, for example, a polymer material, a semiconductor material or a dielectric material. If the intermediate layer comprise a polymer, the polymer may comprise or be an SU-8 photoresist material, benzocyclobuten (BCB), a polyamide, a polymethyl methacrylate (PMMA) or other dye colored film. If the light guide layer comprise a dielectric, the dielectric may comprise or be $SiO_2$, SiN, SiC or other dielectric. If it is a semiconductor material, it may comprise or be silicon or other semiconductor material. The light pipe cavities 124 may be anisotropically etched and/or lithographically patterned into the intermediate layer 160.

The intermediate layer 160 may be composed of a material that is too transparent to function as light guide layer, but can be easily and reliably etched to the high aspect ratios discussed earlier herein. In that case, it may be advantageous to use the intermediate layer 160 to enable the manufacture of such high aspect ratio light pipe cavities 124, and then to coat the cavity sidewalls 130 with a thin metal light guide layer 162.

The metal light guide layer 162 may be coated on the sidewalls 130 of the light pipe cavities 124, utilizing, for example, a blank deposition process, atomic layer deposition, electroless plating or electroplating. Any metal light guide layer 162 that is inadvertently disposed on the bottom surface 164 of the light pipe cavities 124, may be removed by, for example, an anisotropic etch process (such as a reactive ion etching process). The anisotropic etching process leaves the metal light guide layer 162 on the sidewalls 130 of the light pipe cavities 124.

Referring to FIG. 9, a cross sectional view of an example of the image sensor structure 200 of FIG. 8 at an intermediate stage of manufacture is depicted, wherein optical filter material 134 is disposed in the light pipe cavities 124 and wherein the intermediate layer 160, the light guide layer 162, the plurality of light pipe cavities 124 and the optical filter material 134 form a first optical filter stack 136, according to aspects described herein.

The optical filter material 134 is disposed in the light pipe cavities 124 such that it is in direct contact with the light guide layer 162 at the sidewalls 130 of the light pipe cavities 124. Having the optical filter material 134 in direct contact with the light guide layer 162 at the sidewalls 130 of the light pipe cavities 124 assures that no significant amount of excitation light 156 can inadvertently transmit between the optical filter material 134 and light guide layer 162 to reach the light detectors 114 below.

The optical filter material 134 may be a dye based polymer. The material 134 may be spin coated or sprayed into the light pipe cavities 124, baked and/or cured. Any excess optical filter material 134 can be planarized down to the level of the top surface 128 of the intermediate layer 160.

Referring to FIG. 10, a cross sectional view of an example of the image sensor structure 200 of FIG. 9 at a completed stage of manufacture is depicted, wherein a nanowell layer 146 having a plurality of nanowells 148 is disposed over the first optical filter stack 136, according to aspects described herein. All aspects of the image sensor structure 200 are substantially the same or similar to the aspects of the image sensor structure 100 discussed earlier except that the metal light guide layer 162 is disposed on the sidewalls 130 of the light pipe guides 124 and the intermediate layer 160 is mechanically supporting the light guide layer 162.

During operation, certain analytes 152 (such as clusters of DNA segments or the like) may be tagged with a fluorescent labeled molecule 154 and disposed in the nanowells 148. Various types of excitation light 156 may then be radiated onto the analytes 152 in the nanowells 148, causing the labeled molecules 154 to fluoresce emissive light 158. The majority of photons of emissive light 158 may be transmitted through the passivation stack 150 and enter its associate light pipe cavity 124. The light pipe cavity 124 together with its optical filter material 134, act as light guides that may filter out most of the excitation light 156 and direct a significant portion of the emissive light 158 to an associated light detector 114 located directly below the light guide.

The light detectors 114 detect the emissive light photons 158. The device circuitry 112 within the device stack 104 then processes and transmits data signals based on those detected photons of emissive light 158. The data signals may then be analyzed to reveal properties of the analytes 152.

The image sensor structure 200 is a back-side illuminated (BSI) image sensor structure because the nanowells 148 are disposed on the back side of the image sensor structure 200, and because the device stack 104 is not disposed between the nanowell layer 146 and the plurality of light detectors 114. Therefore, the nanowells 148 are illuminated by the excitation light 156 from the back side of the image sensor structure 200.

However, because of the position of the device stack 104, the device circuitry 112 may not be available to aid in the reduction of crosstalk of emissive light photons 158 emanating from a nanowell 148 onto an unassociated light detector 114. To compensate for the lack of a device stack 104, the light guide layer 162 is disposed over the intermediate layer 160 and is utilized to block most of the emissive light 158 and excitation light 156 from transmitting from one light pipe cavity 124 to another.

Additionally, the light guide layer 162 is in direct contact with the optical filter material 134 at the sidewalls 130 of the light pipe cavities 124. As such, little to no excitation light 156 can transmit through the light pipe cavities 124 without going through the optical filter material 134. The optical filter material 134 is operative to block the excitation light 156 and to pass the emissive light 158 through to the light detectors 114.

The high aspect ratio H/W of the light pipe cavities 124 geometrically shapes the optical filter material 134 filling the cavities 124. Therefore, the high aspect ratio of the light pipe cavities 124 aids in providing an adequate height H to the optical filter material 134, which enables the optical filter material 134 to block a significant portion of the excitation light 156 from passing through.

The high aspect ratio H/W of the light pipe cavities 124 also provides a significantly wider top width W relative to the bottom with W' of the light pipe cavities 124. As such, the light pipe cavities 124 may efficiently collect emissive light 158 even when the pitch between the light detectors 114 is as small as, for example, about 0.6 to 0.5 microns or less.

The high aspect ratio H/W of the light pipe cavities 124, may be as high as about 2.5 to 1, about 5 to 1, about 10 to 1, about 20 to 1 or more. Additionally, the sidewall angles θ are small enough to allow for the high aspect ratios in the light pipe cavities 124, yet not so large as to make the manufacture of the light pipe cavities unreliable and/or overly expensive. The sidewall angles θ of the light pipe cavities 124 may be within a range of about 11 degrees to about 1.2 degrees, within a range of about 10 degrees to about 1.5 degrees, within a range of about 6 degrees to about 1.2 degrees, within a range of about 3 degrees to about 1.2 degrees and within a range of about 3 degree to about 1.5 degrees.

Referring to FIG. 11, a cross sectional view of an example of an image sensor structure 300 at an intermediate stage of manufacture is depicted according to aspects described herein. In structure 300 an intermediate layer 166 is disposed over a substrate layer 116 of an image stack 102. The intermediate layer 166 and substrate layer 116 are comprised of the same material. The intermediate layer 166 and substrate layer 116 may comprise or be silicon, silicon germanium, gallium arsenide or other semiconductor material.

During an earlier stage of manufacture, a combined layer 168 may be disposed over the device stack 104 at a height that is at least as high as the heights of the combined image stack 102 and first optical filter stack 136. The combined layer 168 may then be planarized down to a predetermined height 170 that is substantially equal to the combined heights of the image stack 102 and the first optical filter stack 136. At that stage of manufacture, the intermediate layer 166 comprises an upper portion of the combined layer 168 and the substrate layer 116 comprises a lower portion of the combined layer 168.

A plurality of light pipe cavities 124 may be anisotropically etched into the intermediate layer 166. This may be done by, for example, a reactive ion etching process. Because the intermediate layer 166 is a semiconductor material, it is easier to etch to high aspect ratios. However, the intermediate layer 166 is too transparent to function as a light guide layer.

Referring to FIG. 12, a cross sectional view of an example of the image sensor structure 300 of FIG. 11 at an intermediate stage of manufacture, wherein a metal light guide layer 172 is disposed on sidewalls 130 of the light pipe cavities 124, according to aspects described herein. Much like the image sensor structure 200, a metal light guide layer 172 is disposed on sidewalls 130 of the light pipe cavities 124, because the intermediate layer 166 is too transparent to function as a light guide layer.

The light guide layer 172 may comprise, or be, a metal, such as aluminum, gold or copper. However, if the thickness of the metal light guide layer 172 between the light pipe cavities 124 is too great, the metal may absorb too much of the emissive light 158 prior to reaching the light detectors 114. In order to not absorb too much emissive light 158, the thickness of a metal light guide layer 172 between light pipe cavities 124 may be, for example, about 100 nanometers or less, about 50 nanometers or less, or about 40 nanometers or less.

The intermediate layer 166 is disposed over the image stack 102 and provides mechanical support for the relatively thin metal light guide layer 172. The light guide layer 172 is disposed over the intermediate layer 166 on the sidewalls 130 of the light pipe cavities 124.

The metal light guide layer 172 may not be disposed on the bottom surface 174 of the light pipe cavities 124. This is because the metal light guide layer 162, even being as thin as 100 nanometers or less, may reduce, and in some instances even prevent, a significant portion of emissive light 158 from transmitting into the image stack 102 if it were disposed on the bottom surface 174 of the light pipe cavities 124.

The metal light guide layer 172 may be coated on the sidewalls 130 of the light pipe cavities 124 utilizing, for example, a blank deposition process, atomic layer deposition, electroless plating or electroplating. Any metal light guide layer 172 that is inadvertently disposed on the bottom surface 174 of the light pipe cavities 124, may be removed by, for example, an anisotropic etch process (such as a reactive ion etching process). The anisotropic etching process leaves the metal light guide layer 172 on the sidewalls 130 of the light pipe cavities 124.

Referring to FIG. 13, a cross sectional view of an example of the image sensor structure 300 of FIG. 12 at an intermediate stage of manufacture is depicted, wherein optical filter material 134 is disposed in the light pipe cavities 124 and wherein the intermediate layer 166, the light guide layer 172, the plurality of light pipe cavities 124 and the optical filter material 134 form a first optical filter stack 136, according to aspects described herein.

The optical filter material 134 is disposed in the light pipe cavities 124 such that it is in direct contact with the light guide layer 172 at the sidewalls 130 of the light pipe cavities 124. Having the optical filter material 134 in direct contact with the light guide layer 172 at the sidewalls 130 of the light pipe cavities 124 assures that no significant amount of excitation light 156 can inadvertently transmit between the optical filter material 134 and light guide layer 172 to reach the light detectors 114 below.

The optical filter material 134 may be a dye based polymer. The material 134 may be spin coated or sprayed into the light pipe cavities 124, baked and/or cured. Any excess optical filter material 134 can be planarized down to the level of the top surface 128 of the intermediate layer 166.

Referring to FIG. 14, a cross sectional view of an example of the image sensor structure 300 of FIG. 13 at a completed stage of manufacture is depicted, wherein a nanowell layer 146 having a plurality of nanowells 148 is disposed over the first optical filter stack 136, according to aspects described herein. All aspects of the image sensor structure 300 are substantially the same or similar to the aspects of the image sensor structure 200 discussed earlier except that the intermediate layer 166 and the substrate layer 116 are the same material.

During operation, certain analytes 152 (such as clusters of DNA segments or the like) may be tagged with a fluorescent labeled molecule 154 and disposed in the nanowells 148. Various types of excitation light 156 may then be radiated onto the analytes 152 in the nanowells 148, causing the labeled molecules 154 to fluoresce emissive light 158. The majority of photons of emissive light 158 may be transmitted through the passivation stack 150 and enter its associate light pipe cavity 124. The light pipe cavity 124 together with its optical filter material 134, act as light guides that may filter out most of the excitation light 156 and direct a significant portion of the emissive light 158 to an associated light detector 114 located directly below the light guide.

The light detectors 114 detect the emissive light photons 158. The device circuitry 112 within the device stack 104 then processes and transmits data signals based on those detected photons of emissive light 158. The data signals may then be analyzed to reveal properties of the analytes 152.

The image sensor structure 300 is a back-side illuminated (BSI) image sensor structure because the nanowells 148 are disposed on the back side of the image sensor structure 300, and because the device stack 104 is not disposed between the nanowell layer 146 and the plurality of light detectors 114. Therefore, the nanowells 148 are illuminated by the excitation light 156 from the back side of the image sensor structure 300.

However, because of the position of the device stack 104, the device circuitry 112 may not be available to aid in the reduction of crosstalk of emissive light photons 158 emanating from a nanowell 148 onto an unassociated light detector 114. To compensate for the lack of a device stack 104, the light guide layer 172 is disposed over the intermediate layer 166 and is utilized to block most of the emissive light 158 and excitation light 156 from transmitting from one light pipe cavity 124 to another.

Additionally, the light guide layer 172 is in direct contact with the optical filter material 134 at the sidewalls 130 of the light pipe cavities 124. As such, little to no excitation light 156 can transmit through the light pipe cavities 124 without going through the optical filter material 134. The optical filter material 134 is operative to block the excitation light 156 and to pass the emissive light 158 through to the light detectors 114.

The high aspect ratio H/W of the light pipe cavities 124 geometrically shapes the optical filter material 134 filling the cavities 124. Therefore, the high aspect ratio of the light pipe cavities 124 aids in providing an adequate height H to the optical filter material 134, which enables the optical filter material 134 to block a significant portion of the excitation light 156 from passing through.

The high aspect ratio H/W of the light pipe cavities 124 also provides a significantly wider top width W relative to the bottom with W' of the light pipe cavities 124. As such, the light pipe cavities 124 may efficiently collect emissive light 158 even when the pitch between the light detectors 114 is as small as, for example, about 0.6 to 0.5 microns or less.

The high aspect ratio H/W of the light pipe cavities 124, may be as high as about 2.5 to 1, about 5 to 1, about 10 to 1, about 20 to 1 or more. Additionally, the sidewall angles θ are small enough to allow for the high aspect ratios in the light pipe cavities 124, yet not so large as to make the manufacture of the light pipe cavities unreliable and/or overly expensive. The sidewall angles θ of the light pipe cavities 124 may be within a range of about 11 degrees to about 1.2 degrees, within a range of about 10 degrees to about 1.5 degrees, within a range of about 6 degrees to about 1.2 degrees, within a range of about 3 degrees to about 1.2 degrees and within a range of about 3 degree to about 1.5 degrees.

Referring to FIG. 15, a cross sectional view of an example of another image sensor structure 400 at a completed stage of manufacture is depicted, according to aspects described herein. Image sensor structure 400 is similar to image sensor structure 200 except for the addition of a crosstalk blocking layer 180 and a diffusion layer 182.

The crosstalk layer 180 may be disposed over a top surface of the optical filter stack 136, between one or more light pipe cavities 124. The crosstalk layer 180 helps to reduce cross-talk between the light pipe cavities 124.

The crosstalk layer 180 may be comprised of a metal material. The crosstalk layer 180 may be comprised of W, Al, AlSi, Cu or Ta. The crosstalk layer material may comprise a metal material capable of forming a CMOS material. The thickness of the layer 180 may be within a range of about 20 nm to 150 nm.

Though the crosstalk layer 180 is illustrated in this example of image sensor structure 400, crosstalk layer 180 may be used in other image sensor structures as well. For example, the crosstalk layer 180 may be used in any of the example of image sensor structures 100, 200, 300 or 500 (see FIG. 16).

The diffusion layer 182 may be disposed between the optical filter stack 136 and the image stack 102. The diffusion layer 182 may be used to as a diffusion barrier. The diffusion layer 182 may be used to reduce the flow of free ions from the optical filter material 134 or from other impurities such as packaging or humidity. The diffusion layer 182 may also be used as a planarization layer to planarize the surface of the substrate layer 116.

The diffusion layer 182 may be comprised of a dielectric metal oxide material or a nitride material. The diffusion layer 182 may be comprised of, for example, $SiO_2$, $TaO_x$, SiN or SiON. The thickness of the diffusion layer 182 may be within a range of about 50 nm to about 350 nm.

Though the diffusion layer 182 is illustrated in this example of image sensor structure 400, diffusion layer 182 may be used in other image sensor structures as well. For example, the diffusion layer 182 may be used in any of the examples of image sensor structures 100, 200, 300 or 500 (see FIG. 16).

Referring to FIG. 16, a cross sectional view of an example of another image sensor structure 500 at a completed stage of manufacture is depicted, according to aspects described herein. Image sensor structure 500 differs from previous image sensor structures 100-400 primarily in its optical filter stack 136.

In the optical filter stack 136 of image sensor structure 500, the light guide layer 184 is comprised of an optically absorptive material. The optically absorptive material may be, for example, the same material as that of the optical filter material 134 used to fill the light pipe cavities 124 in image sensor structures 100-400. The optically absorptive material may have, for example, an index of refraction within a range of about between 1.5 to 1.8.

The optical filter material 184 may comprise or be, for example, a dye-polymer blend where the dye may have low fluorescence. For example, the dye may comprise or be a member of the metallized azo dye complex class, such as an Orasol Orange type dye, an Orasol Yellow type dye, a Solvent Yellow type dye, a Solvent Orange type dye or a Solvent Red type dye. The polymer may comprise or be, for example, a cellulose acetate butyrate.

Further, unlike the previous image sensor structures 100-400, which have optical filter material 134 disposed in their light pipe cavities 124, an optically transparent material 186 is disposed in the light pipe cavities 124 of image sensor structure 500. The transparent material 186 may be, for example, comprised of a tantalum pent-oxide ($Ta_2O_5$), a titanium dioxide ($TiO_2$) or a silicon nitride (SiN).

The optically transparent material 186 has an index of refraction that is greater than the index of refraction of the optically absorptive material 184. The index of refraction of the transparent material 186 may have an index of refraction within a range of about between 1.8 to 2.7.

The difference in the index of refraction between the optically absorptive material comprising the light guide layer 184 and the optically transparent material 186 disposed in the light pipe cavities 124 significantly reduces cross talk between the light pipe cavities 124 and helps to guide the emissive light 158 through the light pipe cavities and onto the light detectors 114 in the image stack 102. Simultaneously, the optically absorptive material absorbs a major portion of the excitation light 156 and functions to significantly reduce or prevent the excitation light 156 from reaching the light detectors 114.

The greater the ratio of the height H of the light pipe cavities 124 to the maximum width W of the light pipe cavities (i.e., the actual aspect ratio AR of the light pipe cavities), the greater the amount of excitation light 156 that can be absorbed by the optically absorptive material in the light guide layer 184. Therefore, the aspect ratio may be high. For example, the aspect ratio of the light pipe cavities may be about 2.5 to 1 or greater; 5 to 1 or greater; 10 to 1 or greater; 15 to 1 or greater; or 20 to 1 or greater in order to optimize the absorption of excitation light 156.

However, as discussed earlier herein, the sidewall angles θ may be within a range that enables the light pipe cavities to be reasonably manufacturable. For example, the sidewall angles may be within a range of about 1.2 degrees to about 11 degrees, about 1.2 degrees to about 6 degrees, about 1.2 degrees to about 3 degrees, about 1.5 degrees to about 11 degrees, about 1.5 degrees to about 6 degrees or about 1.5 degrees to about 3 degrees.

Moreover, it is important that the optically absorptive material comprising the light guide layer 184 be in direct contact with the optically transparent material 186 disposed in the light pipe cavities 124 at the sidewalls 130 of the light pipe cavities. By being in direct contact, the difference in refraction between the abutting optically absorptive material and optically transparent material 186 helps to guide the emissive light 158 down to the light detectors 114. Additionally, by the optically absorptive material and optically transparent material being in direct contact, less excitation light 156 may radiate between the two materials and inadvertently reach the light detectors 114.

The filter stack 136 also includes metal crosstalk curtains 188 disposed in the light guide layer 184 between the light pipe cavities 124. The crosstalk curtains 188 extend downward from a top surface of the optical filter stack 136 and into the light guide layer 184. The crosstalk curtains 188 function to further reduce crosstalk between the light pipe cavities 124. The crosstalk curtains 188 may work in conjunction with the crosstalk layer 180 to help reduce any crosstalk between light pipe cavities 124 to an insignificant level.

Also, like the crosstalk layer 180, the crosstalk curtains 188 can be used on any image sensor structure. For example, the crosstalk curtains may be used on the image sensor structures 100-400.

The crosstalk curtains 188 may be comprised of a metal material. For example, the crosstalk curtains 188 may be comprised of W, Al, AlSi, Cu, Ta or other CMOS compatible metals.

Though the crosstalk curtains 188 are illustrated in this example of image sensor structure 500, crosstalk curtains 188 may be used in other image sensor structures as well. For example, the crosstalk curtains 188 may be used in any of the examples of image sensor structures 100, 200, 300 or 400.

The filter stack 136 of image sensor structure 500 also may include light pipe extensions 190, which may be disposed at the bottom of the light pipe cavities 124 and which may penetrate through the diffusion layer 182. The light pipe extensions 190 may be comprised of a nitride, such as silicon nitride (SiN), which has an index of refraction of about between 1.7 to 2.1.

The light pipe extensions 190 have an index of refraction that is greater than the index of refraction of the diffusion layer 182. For example, the diffusion layer 182 may be comprised of a $SiO_2$, having an index of refraction of about between 1.4 to 1.55. If so, then a light pipe extension 190 comprising silicon nitride (SiN) may be appropriate, because SiN has an index of refraction of about between 1.7 to 2.1. The index of refraction of the light pipe extensions 190 being greater than the index of refraction of the diffusion layer 182, helps to focus the emissive light 158 onto the light detectors 114 better than if the emissive light were to pass through the diffusion layer 182 rather than the light pipe extensions 190.

Though the light pipe extensions 190 are illustrated in this example of image sensor structure 500, light pipe extensions 190 may be used in other image sensor structures as well. For example, the light pipe extensions 190 may be used in any of the examples of image sensor structures 100, 200, 300 or 400.

It should be appreciated that all combinations of the foregoing concepts and additional concepts discussed in greater detail herein (provided such concepts are not mutually inconsistent) are contemplated as being part of the inventive subject matter disclosed herein and to achieve the benefits and advantages as described herein. In particular, all combinations of claimed subject matter appearing at the end of this disclosure are contemplated as being part of the inventive subject matter disclosed herein.

Although the invention has been described by reference to specific examples, it should be understood that numerous changes may be made within the spirit and scope of the inventive concepts described. Accordingly, it is intended that the disclosure not be limited to the described examples, but that it have the full scope defined by the language of the following claims.

What is claimed is:

1. An image sensor structure, comprising:
   an image stack disposed over a device stack, the image stack comprising a plurality of light detectors;
   a first optical filter stack disposed over the image stack, the first optical filter stack comprising:
   a light guide layer;
   light pipe cavities disposed in the light guide layer, each light pipe cavity associated with a light detector in the plurality of light detectors and each light pipe cavity having an aspect ratio that is greater than about 2.5 to about 1; and
   a nanowell layer disposed over the first optical filter stack;

an intermediate layer disposed over the image stack; and the light guide layer being disposed over the intermediate layer; and a plurality of nanowells disposed in the nanowell layer, each nanowell associated with a light detector in the plurality of light detectors, wherein the light guide layer is a metal layer that is disposed on the sidewalls of the light pipe cavities and is not disposed on the bottom surface of the light pipe cavities.

2. The image sensor structure of claim 1, wherein the light pipe cavities have a sidewall angle that is within the range of about 11 to about 1.2 degrees.

3. The image sensor structure of claim 1, comprising an optical filter material disposed in the light pipe cavities, the optical filter material being in direct contact with the light guide layer at sidewalls of the light pipe cavities.

4. The image sensor structure of claim 1, comprising:
a second optical filter stack disposed over the first optical filter stack;
wherein the first and second optical filter stacks have an overall aspect ratio that is greater than either one of the first filter stack and the second filter stack.

5. The image sensor structure of claim 1,
wherein the light guide layer of the first optical filter stack has a thickness of about 100 nanometers or less.

6. The image sensor structure of claim 5, wherein the image stack comprises:
a substrate layer disposed over the plurality of light detectors, the substrate layer operative to pass emissive light and excitation light;
a plurality of isolation trenches disposed in the substrate layer, each isolation trench disposed adjacent a light detector in the plurality of light detectors; and
a dielectric material disposed in each isolation trench, the dielectric material operative to electrically isolate each light detector in the plurality of light detectors.

7. The image sensor structure of claim 1, comprising:
the light guide layer comprised of an optically absorptive material; and
an optically transparent material disposed in the light pipe cavities, the optically transparent material having an index of refraction that is greater than an index of refraction of the optically absorptive material.

8. The image sensor structure of claim 1, comprising:
a crosstalk layer disposed over a top surface of the optical filter stack, between one or more of the light pipe cavities;
a crosstalk curtain extending down from the top surface of the optical filter stack, between one or more of the light pipe cavities;
a diffusion layer disposed between the optical filter stack and the image stack; and
a light pipe extension disposed at the bottom of one or more of the light pipe cavities, the light pipe extension extending through the diffusion layer.

9. The image sensor structure of claim 8, comprising:
the light guide layer comprised of an optically absorptive material; and
an optically transparent material disposed in the light pipe cavities, the optically transparent material having an index of refraction that is greater than an index of refraction of the optically absorptive material.

10. The image sensor structure of claim 5, comprising:
a crosstalk layer disposed over a top surface of the optical filter stack, between one or more of the light pipe cavities;
a crosstalk curtain extending down from the top surface of the optical filter stack, between one or more of the light pipe cavities;
a diffusion layer disposed between the optical filter stack and the image stack; and
a light pipe extension disposed at the bottom of one or more of the light pipe cavities, the light pipe extension extending through the diffusion layer.

11. An image sensor structure, comprising:
an image stack disposed over a device stack, the image stack comprising a plurality of light detectors;
a first optical filter stack disposed over the image stack, the first optical filter stack comprising:
a light guide layer comprised of optically absorptive material,
light pipe cavities disposed in the light guide layer, each light pipe cavity associated with a light detector in the plurality of light detectors, and
an optically transparent material disposed in the light pipe cavities, the optically transparent material having an index of refraction that is greater than an index of refraction of the optically absorptive material;
a nanowell layer disposed over the first optical filter stack; and
a plurality of nanowells disposed in the nanowell layer, each nanowell associated with a light detector in the plurality of light detectors.

12. The image sensor structure of claim 11, wherein the light pipe cavities have a sidewall angle that is within the range of about 11 to about 1.2 degrees and an aspect ratio that is greater than about 2.5 to about 1.

13. The image sensor structure of claim 11, comprising:
a crosstalk layer disposed over a top surface of the optical filter stack, between one or more of the light pipe cavities;
a crosstalk curtain extending down from the top surface of the optical filter stack, between one or more of the light pipe cavities;
a diffusion layer disposed between the optical filter stack and the image stack; and
a light pipe extension disposed at the bottom of one or more of the light pipe cavities, the light pipe extension extending through the diffusion layer.

14. The image sensor structure of claim 12, comprising:
a crosstalk layer disposed over a top surface of the optical filter stack, between one or more of the light pipe cavities;
a crosstalk curtain extending down from the top surface of the optical filter stack, between one or more of the light pipe cavities;
a diffusion layer disposed between the optical filter stack and the image stack; and
a light pipe extension disposed at the bottom of one or more of the light pipe cavities, the light pipe extension extending through the diffusion layer.

15. The image sensor structure of claim 11, wherein the optically transparent material disposed in the light pipe cavities is in direct contact with the light guide layer at sidewalls of the light pipe cavities.

16. The image sensor structure of claim 11, comprising:
a second optical filter stack disposed over the first optical filter stack;
wherein the first and second optical filter stacks have an overall aspect ratio that is greater than either one of the first filter stack and the second filter stack.

17. A method of forming an image sensor structure, the method comprising:

disposing an image stack over a device stack, the image stack comprising a plurality of light detectors;

disposing a light guide layer over the image stack;

etching a plurality of light pipe cavities in the light guide layer, each light pipe cavity associated with a light detector in the plurality of light detectors, the light pipe cavities having an aspect ratio that is greater than about 2.5 to about 1 and a sidewall angle that is within the range of about 11 to about 1.2 degrees;

disposing a nanowell layer over the light guide layer; and disposing a plurality of nanowells in the nanowell layer, each nanowell associated with a light detector in the plurality of light detectors;

wherein the light guide layer and the plurality of light pipe cavities comprise a first optical filter stack disposed over the image stack disposing an intermediate layer over the image stack; and disposing the light guide layer over the intermediate layer;

wherein the light guide layer is a metal layer that is disposed on the sidewalls of the light pipe cavities and is not disposed on the bottom surface of the light pipe cavities.

18. The method of claim 17, wherein the light guide layer has a thickness of about 100 nanometer or less.

19. The method of claim 17, comprising:

disposing a second optical filter stack over the first optical filter stack;

wherein the first and second optical filter stacks have an overall aspect ratio that is greater than either one of the first filter stack and the second filter stack.

20. The method of claim 17, comprising:

wherein the light guide layer is comprised of an optically absorptive material; and disposing an optically transparent material in the light pipe cavities, the optically transparent material having an index of refraction that is greater than an index of refraction of the optically absorptive material.

* * * * *